US012785636B2

(12) United States Patent
Lehtola

(10) Patent No.: US 12,785,636 B2
(45) Date of Patent: Nov. 3, 2026

(54) LOAD MODULATOR WITH VARIABLE CAPACITANCE

(71) Applicant: SKYWORKS SOLUTIONS, INC., Irvine, CA (US)

(72) Inventor: Philip John Lehtola, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 461 days.

(21) Appl. No.: 18/141,910

(22) Filed: May 1, 2023

(65) Prior Publication Data

US 2023/0361734 A1 Nov. 9, 2023

Related U.S. Application Data

(60) Provisional application No. 63/337,160, filed on May 1, 2022.

(51) Int. Cl.
*H03F 3/26* (2006.01)
*H03F 1/56* (2006.01)

(52) U.S. Cl.
CPC ............... *H03F 3/26* (2013.01); *H03F 1/565* (2013.01); *H03F 2200/451* (2013.01)

(58) Field of Classification Search
CPC ........ H03F 3/26; H03F 2200/451; H03F 3/72; H03F 2200/111; H03F 2200/378; H03F 2200/387; H03F 1/565; H03F 2200/411; H03F 2200/534; H03F 2200/537; H03F 2200/541; H03F 2203/7209; H03F 3/195; H03F 3/211; H03F 1/22; H03F 3/245; H03F 1/50; H03F 1/08; H03F 3/68; H03F 3/265; H03H 7/0161; H01F 19/04; H01F 19/02; H01F 19/00
See application file for complete search history.

(56) References Cited

U.S. PATENT DOCUMENTS

| | | | | |
|---|---|---|---|---|
| 9,209,754 | B2 * | 12/2015 | Embar | H03F 1/0288 |
| 9,800,207 | B2 * | 10/2017 | Datta | H03F 1/565 |
| 11,671,061 | B2 * | 6/2023 | Gebeyehu | H03F 3/195 330/276 |
| 2015/0155831 | A1 | 6/2015 | Shirvani | |
| 2017/0324386 | A1 | 11/2017 | Schemmann | |
| 2020/0350879 | A1 | 11/2020 | Broughton et al. | |
| 2021/0075371 | A1 * | 3/2021 | Chatterjee | H03F 1/56 |
| 2021/0351746 | A1 | 11/2021 | Ghannouchi | |
| 2021/0391835 | A1 * | 12/2021 | Kazuno | H03F 3/26 |
| 2022/0077828 | A1 * | 3/2022 | Honda | H03F 3/211 |
| 2022/0189936 | A1 | 6/2022 | Tsutsui et al. | |

OTHER PUBLICATIONS

International Search Report dated Jun. 17, 2024 for PCT/US2023/075255.
Written Opinion dated Jun. 17, 2024 for PCT/US2023/075255.

* cited by examiner

*Primary Examiner* — Khanh V Nguyen
(74) *Attorney, Agent, or Firm* — Chang & Hale LLP

(57) ABSTRACT

In some embodiments, an amplifier circuit can be configured to amplify a radio-frequency signal and include an input stage and an output stage coupled to the input stage and having an output node. The amplifier circuit can further include a load modulation circuit coupled to the output node of the output stage and configured to provide variable capacitance that depends on a control voltage. In some embodiments, the amplifier circuit can be implemented as a power amplifier circuit.

13 Claims, 26 Drawing Sheets

CAPACITANCE VS. VCTRL

| SPLIT | U3-LOAD MODULATOR | SWITCH DEVICE | DIVIDER | VCTRL | BIA BW | MAX CAP |
|---|---|---|---|---|---|---|
| A | WAFER 5 UT010-100N | 1.6x60x1 | div 1 | 15mA | 300MHz | 1.8pF |
| D | WAFER 5 UT010-103N | 1.6x60x1 | div 1 | 15mA | 400MHz | 1.8pF |
| G | WAFER 5 UT010-106N | 1.6x60x1 | div 1 | 10mA | 300MHz | 1.8pF |
| J | WAFER 5 UT010-109N | 1.6x60x1 | div 1 | 10mA | 400MHz | 1.8pF |
| M | WAFER 5 UT010-112N | 1.6x60x1 | div 1 | 25mA | 300MHz | 1.8pF |
| P | WAFER 5 UT010-115N | 1.6x60x1 | div 1 | 25mA | 400MHz | 1.8pF |

ESR VS. CAPACITANCE
| SPLIT | U3-LOAD MODULATOR | SWITCH DEVICE | DIVIDER | VCTRL | BIA BW | MAX CAP |
|---|---|---|---|---|---|---|
| A | WAFER 5 UT010-100N | 1.6x60x1 | div 1 | 15mA | 300MHz | 1.8pF |
| D | WAFER 5 UT010-103N | 1.6x60x1 | div 1 | 15mA | 400MHz | 1.8pF |
| G | WAFER 5 UT010-106N | 1.6x60x1 | div 1 | 10mA | 300MHz | 1.8pF |
| J | WAFER 5 UT010-109N | 1.6x60x1 | div 1 | 10mA | 400MHz | 1.8pF |
| M | WAFER 5 UT010-112N | 1.6x60x1 | div 1 | 25mA | 300MHz | 1.8pF |
| P | WAFER 5 UT010-115N | 1.6x60x1 | div 1 | 25mA | 400MHz | 1.8pF |
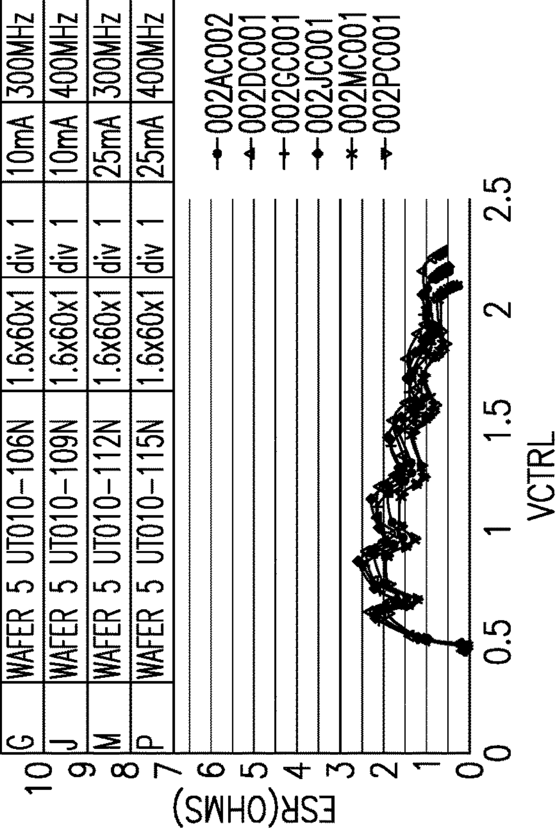
FIG.13
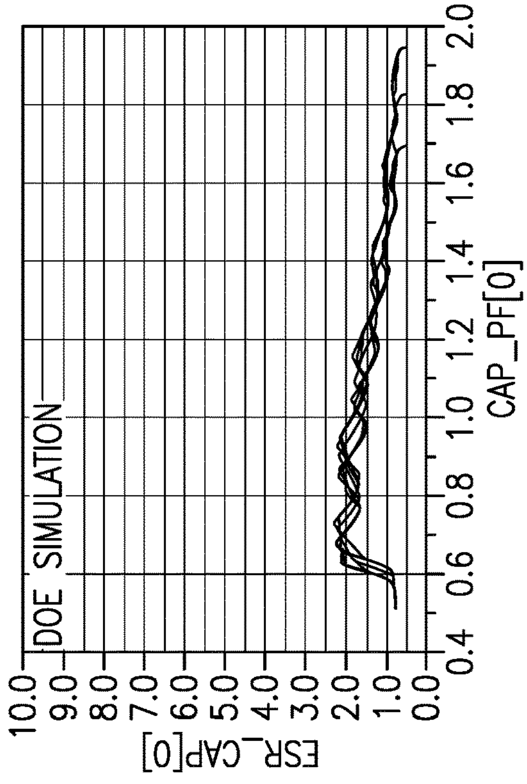

LOAD MODULATOR WITH VARIABLE CAPACITANCE

CROSS-REFERENCE TO RELATED APPLICATION(S)

This application claims priority to U.S. Provisional Application No. 63/337,160 filed May 1, 2022, entitled LOAD MODULATOR WITH VARIABLE CAPACITANCE, the disclosure of which is hereby expressly incorporated by reference herein in its entirety.

BACKGROUND

Field

The present disclosure relates to amplifiers for radio-frequency (RF) applications.

Description of the Related Art

In electronic applications such as radio-frequency (RF) applications, signals can be amplified for a number of reasons. For example, an RF signal to be transmitted can be amplified by a power amplifier, and such an amplified signal can be routed to an antenna for transmission.

SUMMARY

In accordance with a number of implementations, the present disclosure relates to a power amplifier that includes an input stage and an output stage coupled to the input stage and having an output node. The power amplifier further includes a load modulation circuit coupled to the output node of the output stage and configured to provide variable capacitance that depends on a control voltage.

In some embodiments, the input stage can be implemented as a driver stage, and the output stage can be implemented as a final stage. In some embodiments, the driver stage can be implemented as a cascode driver stage. In some embodiments, the cascode driver stage can be configured to operate with a Class AB bias.

In some embodiments, the final stage can be implemented as a push-pull amplifier. The push-pull amplifier can include a splitter having an input and a pair of outputs, with each output coupled to an input of a respective amplifier. The push-pull amplifier can further include a combining circuit that combines outputs of the pair of amplifiers. In some embodiments, each of the pair of amplifiers can be configured to operate with a Class AB bias.

In some embodiments, the combining circuit can include a transformer circuit having a primary with first and second nodes coupled to the outputs of the pair of amplifiers, and a secondary with first and second nodes, with the first node coupled to an output node and the second node coupled to ground through the load modulator.

In some embodiments, the load modulator can include a plurality of switchable capacitances arranged in parallel between a node that is coupled to the output node of the final stage and ground. Each switchable capacitance can include a series arrangement of a capacitance and a switch, such that turning on the switch results in the respective capacitance contributing to a total capacitance of the load modulator.

In some embodiments, each switch can be coupled to a common control node through a respective bias path. The bias path can be configured such that the switch turns on at a respective value of the control voltage different from control voltage values associated with the other switch(es). The bias paths can include different numbers of diodes to accommodate the different control voltage values turning on the respective switches. The first bias path can have no diode, and the remaining bias paths can include successively increasing number of diodes arranged in series. In some embodiments, the load modulator can include six or more switchable capacitances arranged in parallel.

In some embodiments, each bias path can include a respective resistance selected to turn of the respective switch with the provided control voltage.

In some embodiments, each switch can be implemented as a transistor having a base, a collector and an emitter, with the base coupled to the common control node through the respective bias path, and the collector coupled to the respective capacitance, the emitter coupled to the ground.

In some embodiments, the base of each transistor can be coupled to the ground through a path including a series arrangement of a diode and a resistance.

In some embodiments, the base of each transistor can be coupled to the ground through a path including a capacitance.

In some embodiments, the base of each transistor can be coupled to the ground through a pull down circuit having a first node coupled to the base of the transistor and a second node coupled to the ground. The pull down circuit can be configured to turn on and divert a bias voltage from the base of the transistor to the ground if the bias voltage exceeds a threshold value. In some embodiments, the pull down circuit can include a transistor having a base, a collector and an emitter, with the collector coupled to the first node, the emitter coupled to the second node, the collector coupled to the base through a Schottky diode, and the emitter coupled to the collector through a diode.

In some implementations, the present disclosure relates to a method for amplifying a radio-frequency signal. The method includes partially amplifying a signal with an input stage, and further amplifying an amplified signal obtained from at least the input stage with an output stage. The method further includes providing load modulation for the further-amplified signal by providing a variable capacitance to an output node of the output stage, with the variable capacitance depending on a control voltage.

In some implementations, the present disclosure relates to a semiconductor die that includes a substrate and a power amplifier circuit implemented on the substrate. The power amplifier circuit includes an input stage and an output stage coupled to the input stage and having an output node. The power amplifier circuit further includes a load modulation circuit coupled to the output node of the output stage and configured to provide variable capacitance that depends on a control voltage.

In some embodiments, the substate can be configured to support heterojunction bipolar transistors.

In some implementations, the present disclosure relates to a packaged module that includes a power amplifier circuit implemented on the packaging substrate. The power amplifier circuit includes an input stage and an output stage coupled to the input stage and having an output node. The power amplifier circuit further includes a load modulation circuit coupled to the output node of the output stage and configured to provide variable capacitance that depends on a control voltage.

In some embodiments, the power amplifier circuit can be implemented on a single semiconductor die.

In some embodiments, the packaged module can be implemented as a power amplifier module.

In some implementations, the present disclosure relates to a wireless device that includes an antenna and an amplifier circuit configured to amplify a radio-frequency signal associated with the antenna. The amplifier circuit includes an input stage and an output stage coupled to the input stage and having an output node. The amplifier circuit further includes a load modulation circuit coupled to the output node of the output stage and configured to provide variable capacitance that depends on a control voltage.

In some embodiments, the amplifier circuit can be implemented as a power amplifier circuit. The antenna can be configured to support a transmit operation of the amplified radio-frequency signal provided by the power amplifier.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 13 shows plots of effective series resistance (ESR) vs capacitance measured on a sample load modulator based on the design of FIG. 2.

DETAILED DESCRIPTION OF SOME EMBODIMENTS

The headings provided herein, if any, are for convenience only and do not necessarily affect the scope or meaning of the claimed invention.

Described herein are various examples related to a variable capacitance circuit that can be utilized to modulate the load of a power amplifier in a dynamic manner with low loss, high linearity and wide control bandwidth. Although various examples are described herein in the context of power amplifiers, it will be understood that in some embodiments, one or more features of the present disclosure can also be utilized for other types of amplifiers.

Figure 1:
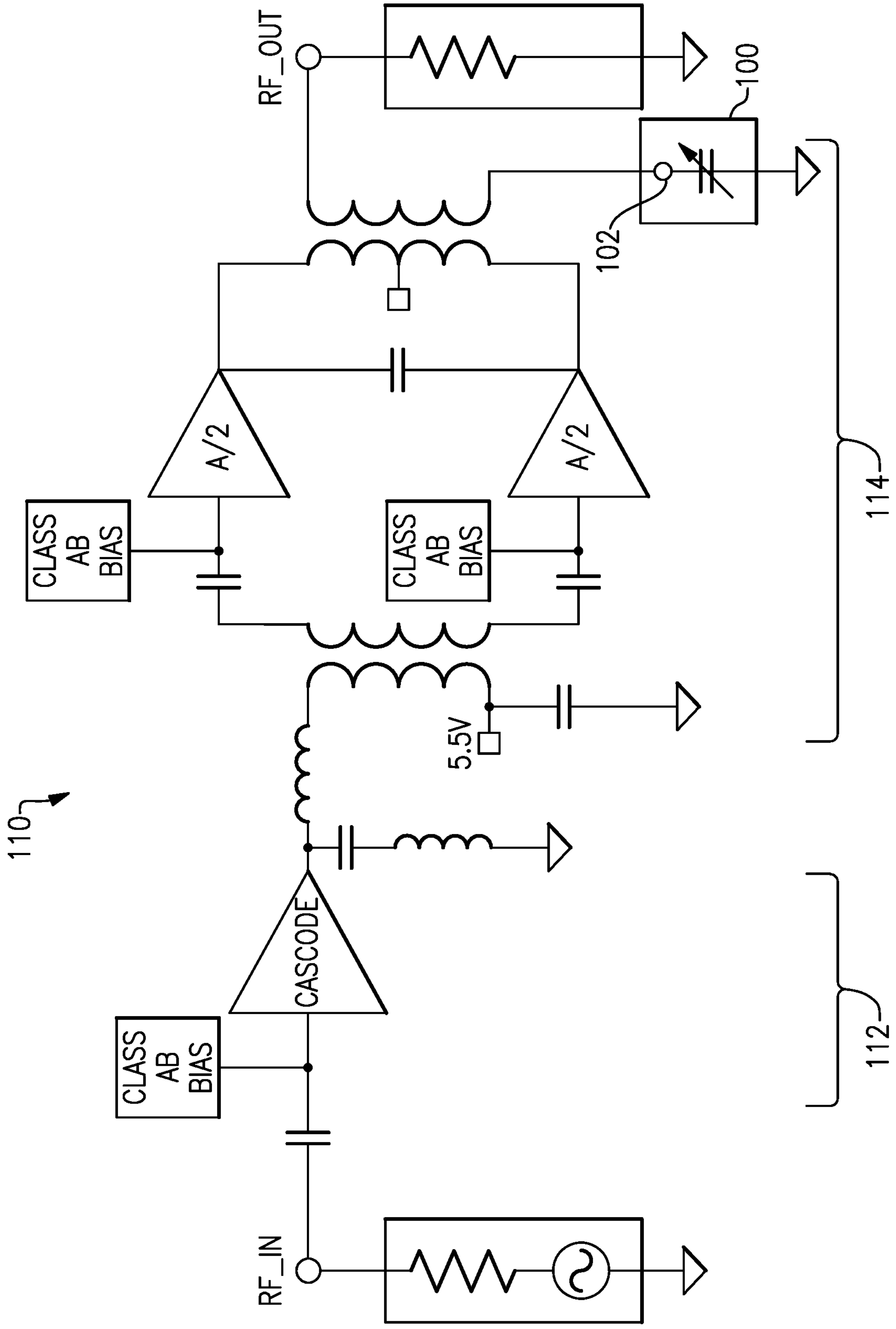
FIG. 1 shows a power amplifier having a load modulated push pull architecture.

FIG. 1 shows a power amplifier 110 having a load modulated push-pull architecture. In the example of FIG. 1, the power amplifier 110 is shown to include a cascode driver stage 112 and an inverse F push-pull final stage 114. In some embodiments, a load modulator (LM) 100 having variable capacitance can be coupled to a combiner 115 that combines the outputs of two amplifiers (each indicated as A/2 in FIG. 1) of the push-pull final stage 114. In the example of FIG. 1, the load modulator 100 is shown to be implemented between a node 102 and a ground.

In the example of FIG. 1, each of the cascode driver stage 112 and the push-pull final stage 114 is depicted as being provided with Class AB bias. However, it will be understood that one or more features of the present disclosure can also be implemented in power amplifiers having different bias configurations.

Figure 2:
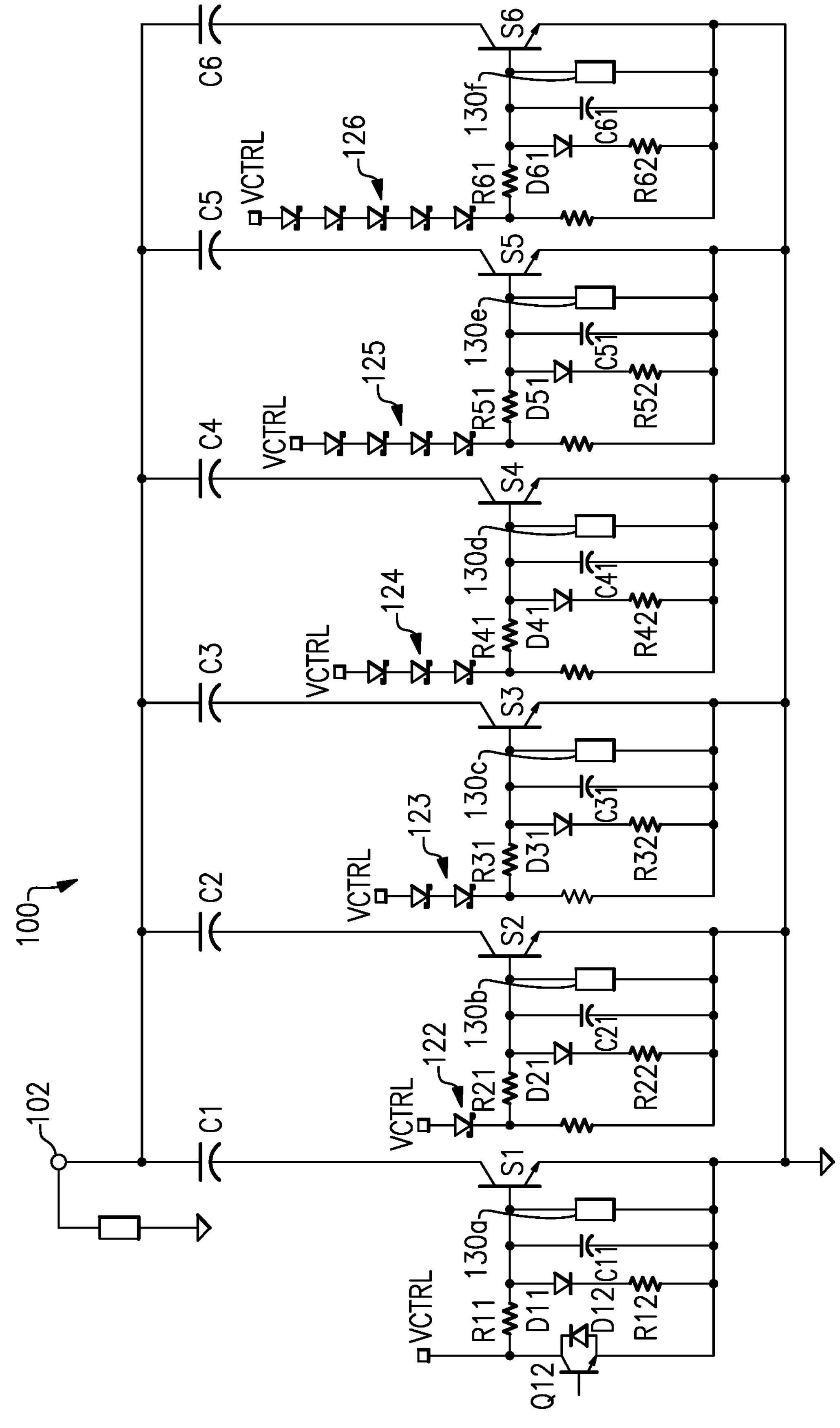
FIG. 2 shows an example of a load modulator that can be a more specific example of the load modulator of FIG. 1.

FIG. 2 shows an example of a load modulator (LM) 100 that can be a more specific example of the load modulator 100 of FIG. 1. In the example of FIG. 2, the load modulator 100 is shown to include six series assemblies of capacitances C1, C2, C3, C4, C5, C6 and their respective switches S1, S2, S3, S4, S5, S6 arranged in a parallel manner between a node 102 (e.g., node 102 in FIG. 1) and a ground. More particularly, C1 and S1 are arranged in series between the node 102 and the ground, C2 and S2 are arranged in series between the node 102 and the ground, C3 and S3 are arranged in series between the node 102 and the ground, C4 and S4 are arranged in series between the node 102 and the ground, C5 and S5 are arranged in series between the node 102 and the ground, and C6 and S6 are arranged in series between the node 102 and the ground.

In the example of FIG. 2, the base of each switch is shown to be coupled to a voltage node for receiving a control voltage VCTRL. The base of S1 is shown to be coupled to the voltage node through a resistance R11; the base of S2 is shown to be coupled to the voltage node through a resistance R21 and one diode (e.g., Schottky diode) 122, the base of S3 is shown to be coupled to the voltage node through a resistance R31 and two diodes (e.g., Schottky diodes) 123, the base of S4 is shown to be coupled to the voltage node through a resistance R41 and three diodes (e.g., Schottky diodes) 124, the base of S5 is shown to be coupled to the voltage node through a resistance R51 and four diodes (e.g., Schottky diodes) 125, and the base of S6 is shown to be coupled to the voltage node through a resistance R61 and five diodes (e.g., Schottky diodes) 126.

In the example of FIG. 2, the base of each switch is shown to be coupled to the ground through a parallel arrangement of a diode plus resistance, a capacitance, and a pull down circuit. More particularly, the base of S1 is shown to be coupled to the ground through a parallel arrangement of diode D11 plus resistance R12, capacitance C11, and pull down circuit 130*a*. Similarly, the base of S2 is shown to be coupled to the ground through a parallel arrangement of diode D21 plus resistance R22, capacitance C21, and pull down circuit 130*b*. Similarly, the base of S3 is shown to be coupled to the ground through a parallel arrangement of diode D31 plus resistance R32, capacitance C31, and pull down circuit 130*c*. Similarly, the base of S4 is shown to be coupled to the ground through a parallel arrangement of diode D41 plus resistance R42, capacitance C41, and pull down circuit 130*d*. Similarly, the base of S5 is shown to be coupled to the ground through a parallel arrangement of diode D51 plus resistance R52, capacitance C51, and pull down circuit 130*e*. Similarly, the base of S6 is shown to be coupled to the ground through a parallel arrangement of diode D61 plus resistance R62, capacitance C61, and pull down circuit 130*f*.

In the example of FIG. 2, the voltage node associated with each of the switches S2 to S6 is shown to be coupled to the ground through a respective resistance. More particularly, the voltage node VCTRL for the switch S2 is shown to be coupled to the ground through the diode-assembly 122 and resistance R2; the voltage node VCTRL for the switch S3 is shown to be coupled to the ground through the diode-assembly 123 and resistance R3; the voltage node VCTRL for the switch S4 is shown to be coupled to the ground through the diode-assembly 124 and resistance R4; the voltage node VCTRL for the switch S5 is shown to be coupled to the ground through the diode-assembly 125 and resistance R5; and the voltage node VCTRL for the switch S6 is shown to be coupled to the ground through the diode-assembly 126 and resistance R6. It is noted that the resistances R2, R3, R4, R5 and R6 may or may have same value.

In the example of FIG. 2, the voltage node associated with the switch S1 is shown to be couple to the ground through a parallel combination of a transistor Q12 and a diode 12.

In some embodiments, the switches S1 to S6 can be implemented as heterojunction bipolar transistors (HBTs) having high breakdown property. As shown in FIG. 2, each of such HBT devices is controlled with control voltage VCTRL. The HBT devices S1 to S6 can be turned on in sequence to produce a linear or approximately linear relationship between capacitance and the control voltage VCTRL.

Referring to the example of FIG. 2, to provide the lowest capacitance of the load modulator 100, all of the switches S1 to S6 can be turned off. As VCTRL increases, S1 turns on first by itself, followed by S2 to provide S1 and S2 being on, followed by S3 to provide 1 to S3 being on, followed by S4 to provide S1 to S4 being on, followed by S5 to provide S1 to S5 being on, followed by S6 to provide S1 to S6 being on. Such turning-on sequence of the switches can be achieved by the above-described arrangement of the couplings (diodes and resistors to set respective turn-on thresholds) between the VCTRL voltage node and the bases of the switches.

In some embodiments, the capacitance that couples each base to the ground (C11, C21, C31, C41, C51, C61) can be implemented with a sufficiently large value to provide RF filtering, but small enough to avoid limiting the bandwidth of the capacitance vs VCTRL relationship.

It is noted that the foregoing configuration of the load modulator 100 of FIG. 2 provides a low impedance control voltage (VCTRL) interface with minimal or reduced capacitance to allow the capacitance to change dynamically with a wide bandwidth modulation.

In the example of FIG. 2, the load modulator 100 has six capacitances (C11, C21, C31, C41, C51, C61). It will be understood that other numbers of capacitances can also be utilized.

Figure 3:
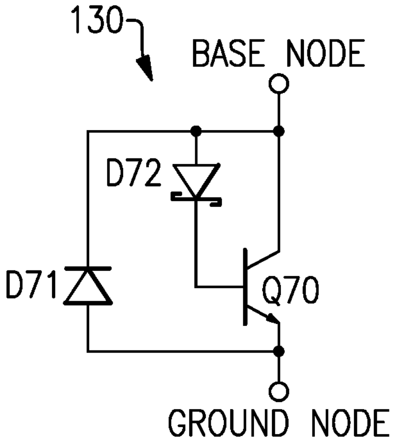
FIG. 3 shows that in some embodiments, a pull down circuit can be utilized for each pull down circuit of the load modulator of FIG. 2.

FIG. 3 shows that in some embodiments, a pull down circuit 130 can be utilized for each pull down circuit (130*a*, 130*b*, 130*c*, 130*d*, 130*e*, 130*f*) of the load modulator 100 of FIG. 2. More particularly, a transistor Q70 is shown to be provided between the base node of the respective switch (of the load modulator 100 of FIG. 2) and the ground, so that the collector is connected to the base node, and the emitter is connected to the ground. A diode D71 is shown to be provided between the base node and the ground, so that the cathode is connect to the base node, and the anode is connected to the ground. A Schottky diode D72 is shown to be provided between the base node and the base of the transistor Q70, such that the anode is connected to the base node, and the cathode is connected to the base of the transistor Q70. Configured in the foregoing manner, the pull down circuit 130 can turn on and divert the voltage from the base node to ground if the voltage exceeds some threshold value.

Figure 4A:
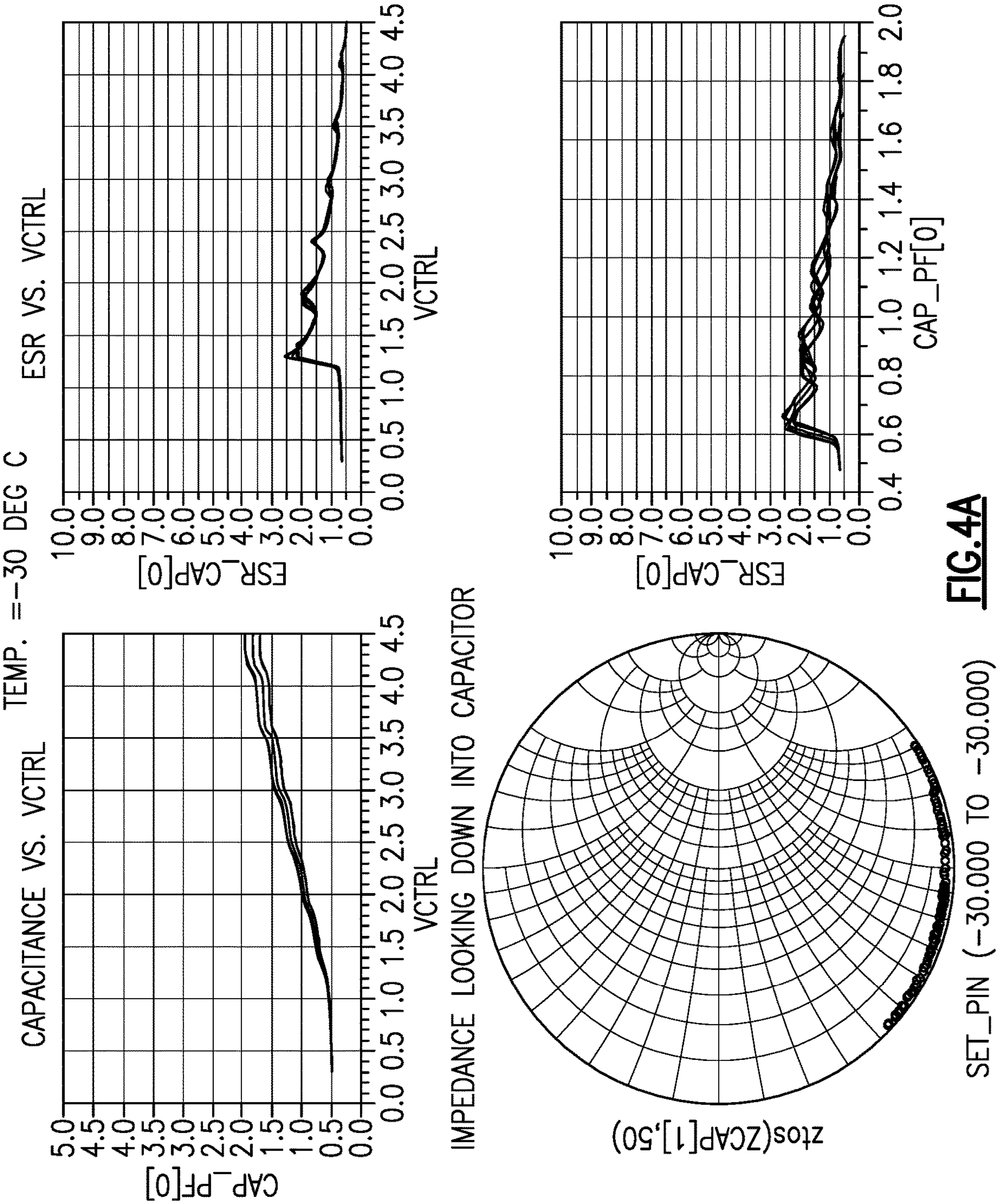
FIGS. 4A to 4C show various simulation results obtained for the load modulator of FIG. 2 in operation at different temperatures.
Figure 4B:
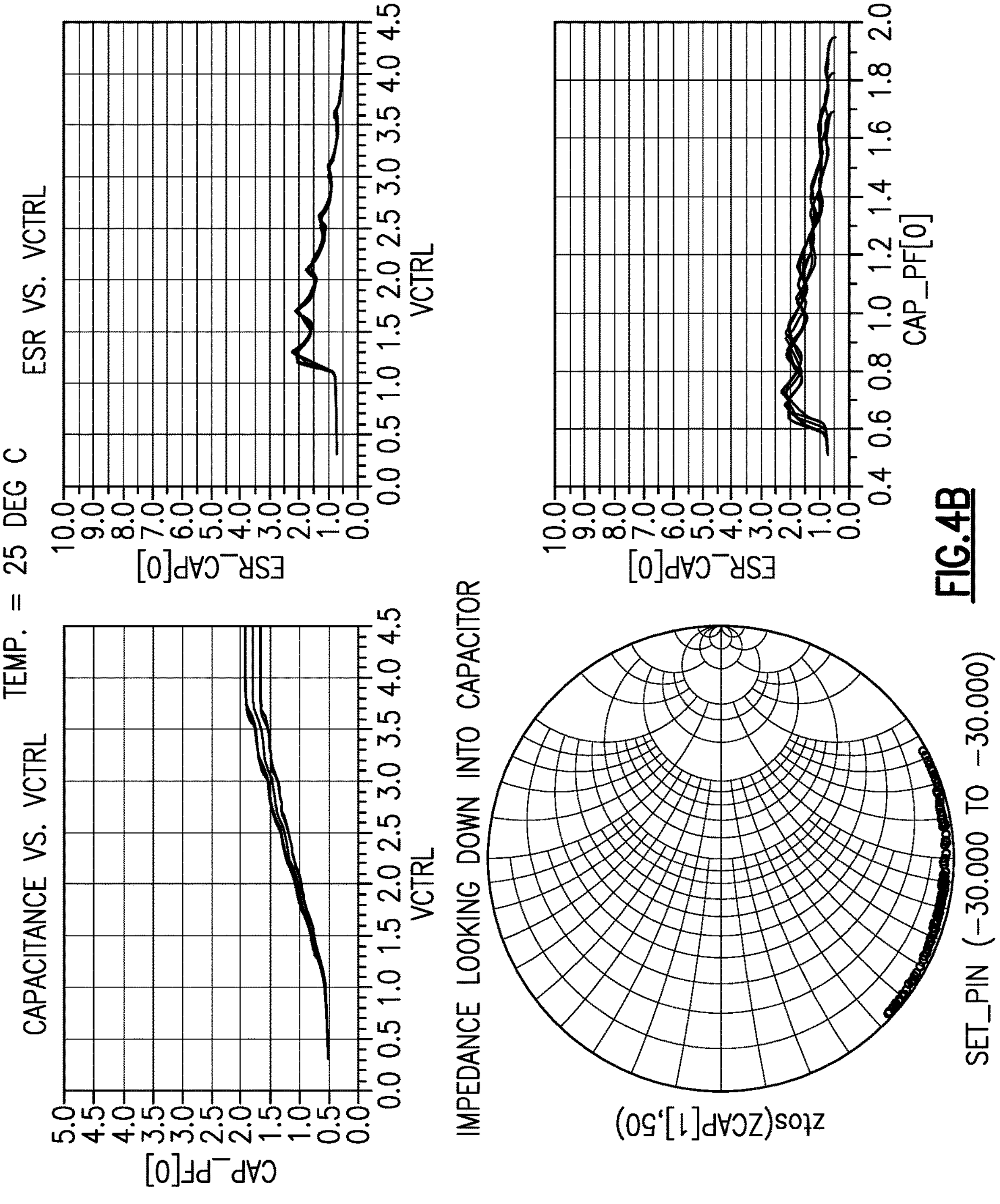
Figure 4C:
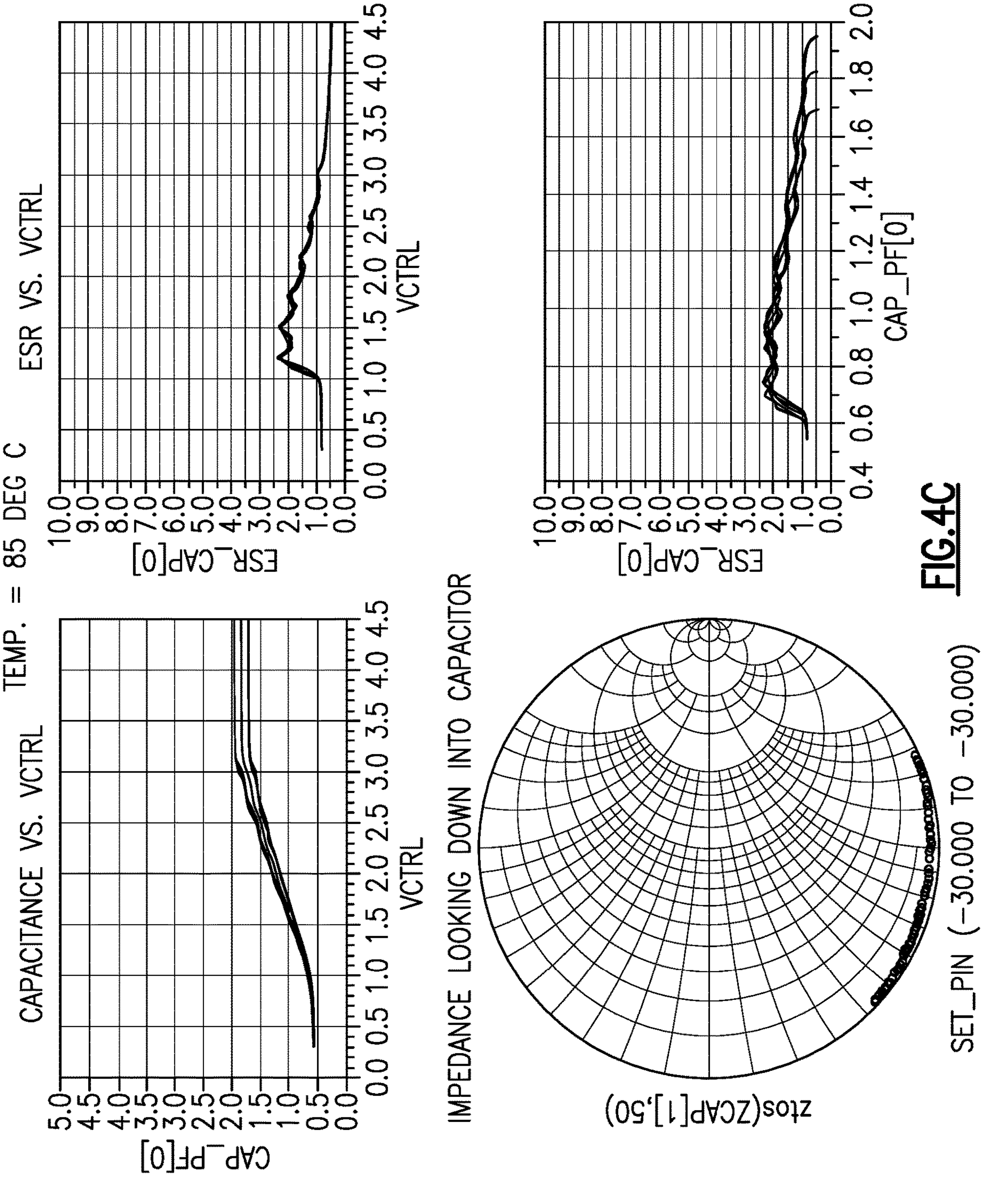

FIGS. 4A to 4C show various simulation results obtained for the load modulator 100 of FIG. 2 in operation at different temperatures. FIG. 4A shows the results for operation at −30 deg. C., FIG. 4B shows the results for operation at 25 deg. C., and FIG. 4C shows the results for operation at 84 deg. C. Among others, the simulation results show a generally linear relationship, in a respective range for a given operating temperature, between control voltage VCTRL and capacitance being enabled by the control voltage. More particularly, and as seen in the capacitance vs VCTRL plot of FIG. 4A, control voltage VCTRL and capacitance are shown to have a generally linear relationship in a VCTRL range of about 1.0V to about 4.5V. As seen in the capacitance vs VCTRL plot of FIG. 4B, control voltage VCTRL and capacitance are shown to have a generally linear relationship in a VCTRL range of about 1.0V to about 3.7V. As seen in the capacitance vs VCTRL plot of FIG. 4C, control voltage VCTRL and capacitance are shown to have a generally linear relationship in a VCTRL range of about 1.0V to about 3.1V.

Figure 5:
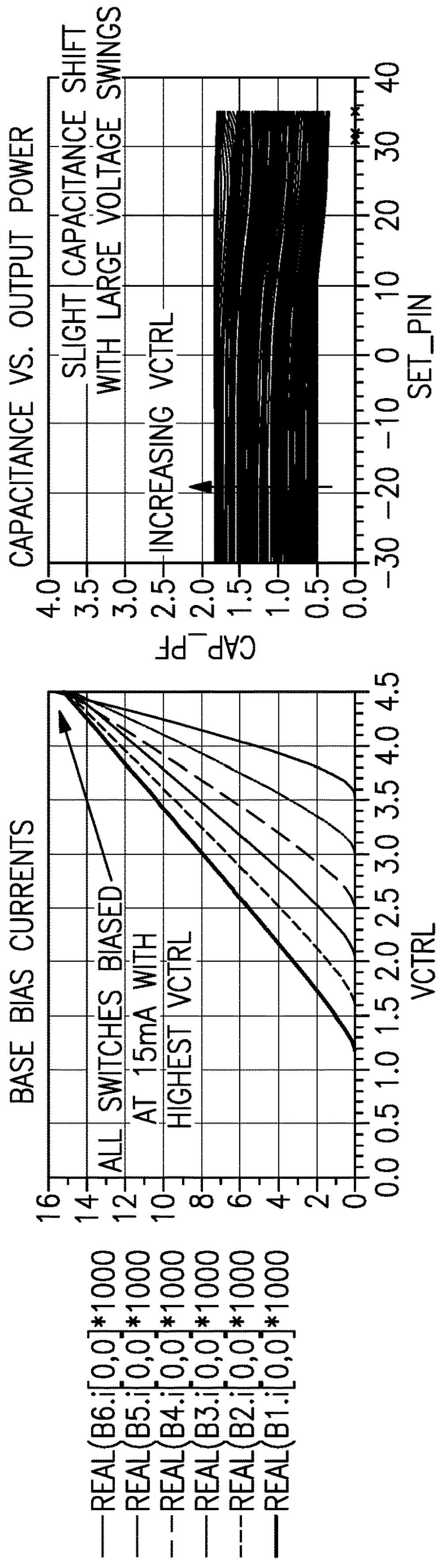
FIG. 5 shows plots of base bias currents as a function of control voltage for six switches of the load modulator of FIG. 2, and plots of capacitance provided by the load modulator as a function of output power as the control voltage is swept in a range.

FIG. 5 shows plots of base bias currents as a function of control voltage VCTRL for the six switches (S1, S2, S3, S4, S5, S6) of the load modulator 100 of FIG. 2 in the left panel, and plots of capacitance provided by the load modulator as a function of output power as the control voltage VCTRL is swept in a range (in the right panel). Referring to the left panel, it is noted that all of the six switches are biased at approximately 15 mA with the highest control voltage VCTRL=4.5V. Referring to the right panel, it is noted that there can be a slight capacitance shift when the output power includes large voltage swings.

Figure 6:
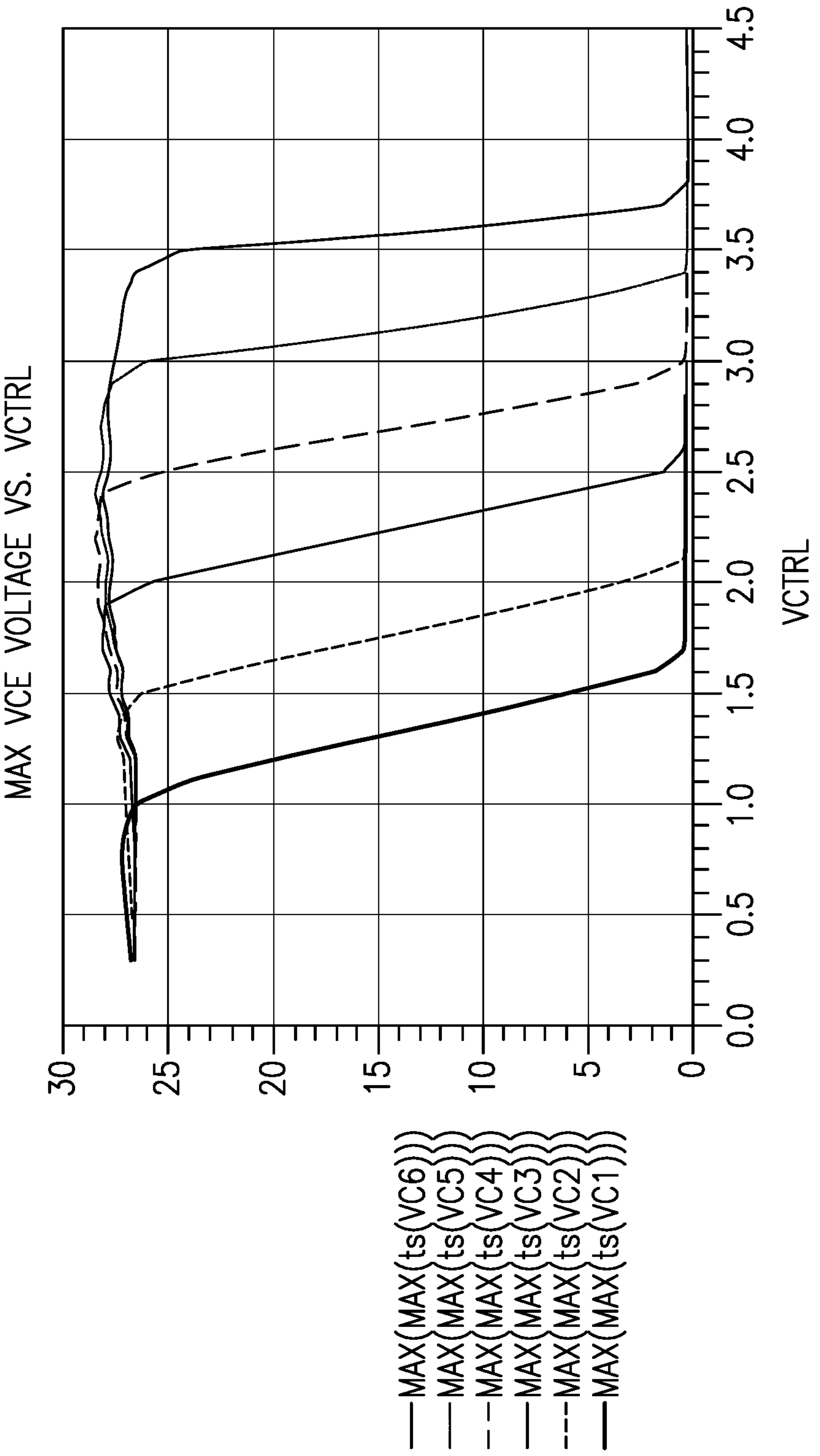
FIG. 6 shows plots of maximum VCE voltage vs control voltage, showing peaks across the devices with no capacitive dividers.

FIG. 6 shows plots of maximum VCE voltage vs VCTRL for the six switches (S1, S2, S3, S4, S5, S6) of the load modulator 100 of FIG. 2, showing 26V to 28V peaks across the devices with no capacitive dividers.

Figure 7:
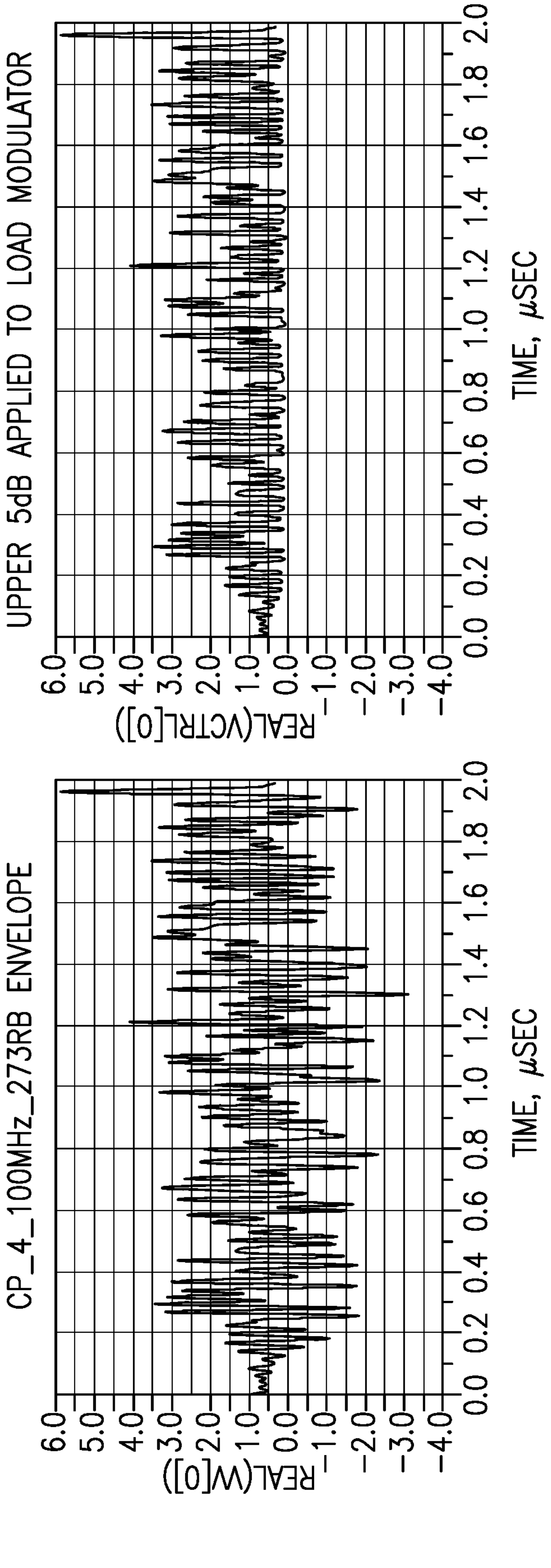
FIG. 7 shows an example of a 100 MHz envelope on the left panel, and the upper 5 dB of the envelope applied to the load modulator control voltage.

FIG. 7 shows an example of a 100 MHz envelope on the left panel, and the upper 5 dB of the envelope applied to the load modulator VCTRL. One can see that VCTRL is consistent with a tuning range of 1V to 4.5V.

Figure 8:
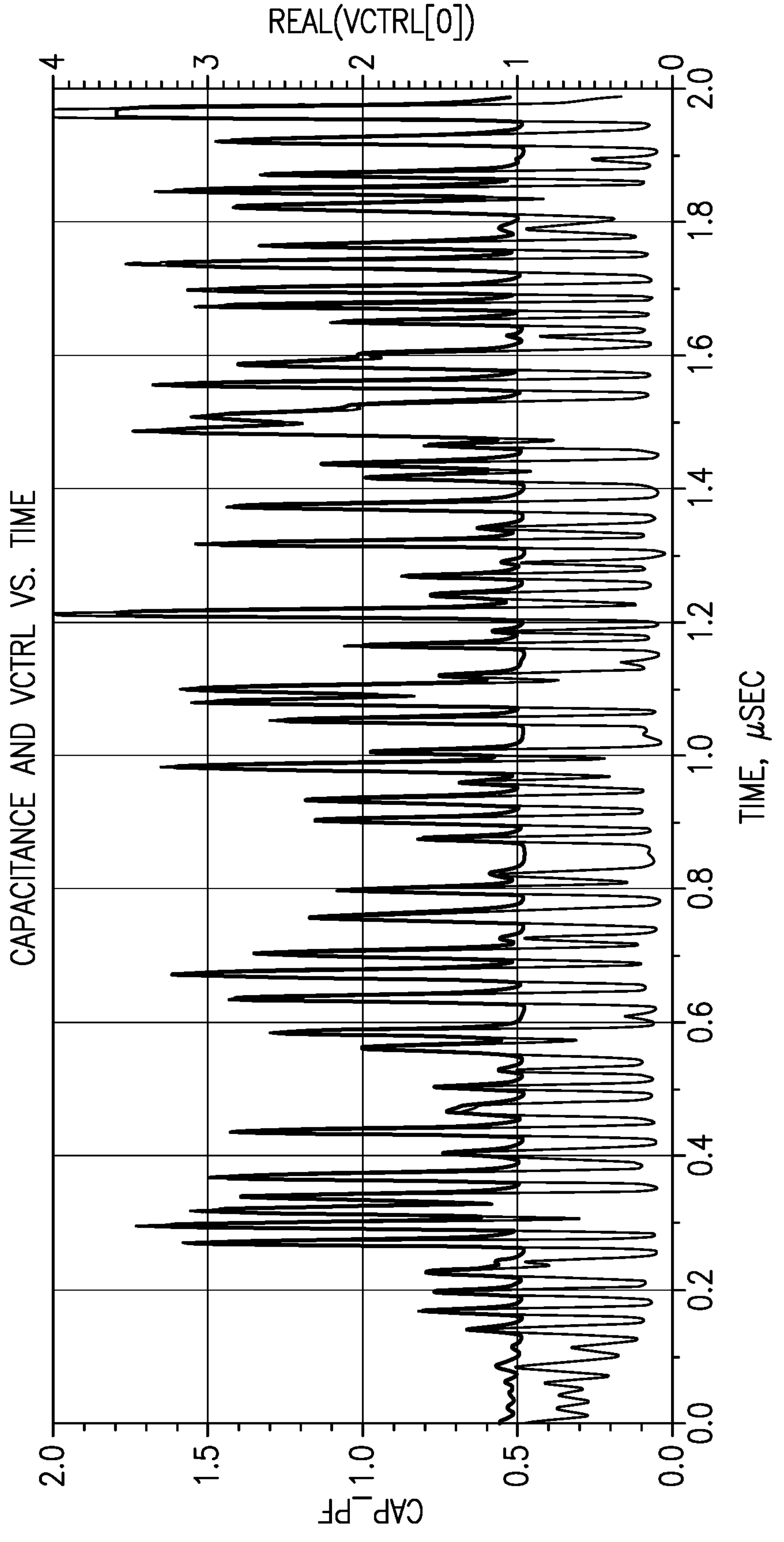
FIG. 8 shows superimposed time traces of capacitance provided by the load modulator and the control voltage.

FIG. 8 shows superimposed time traces of capacitance provided by the load modulator 100 of FIG. 2 and the control voltage VCTRL. Once can see that the capacitance tracks the control voltage VCTRL with 100 MHz modulation.

Figure 9:
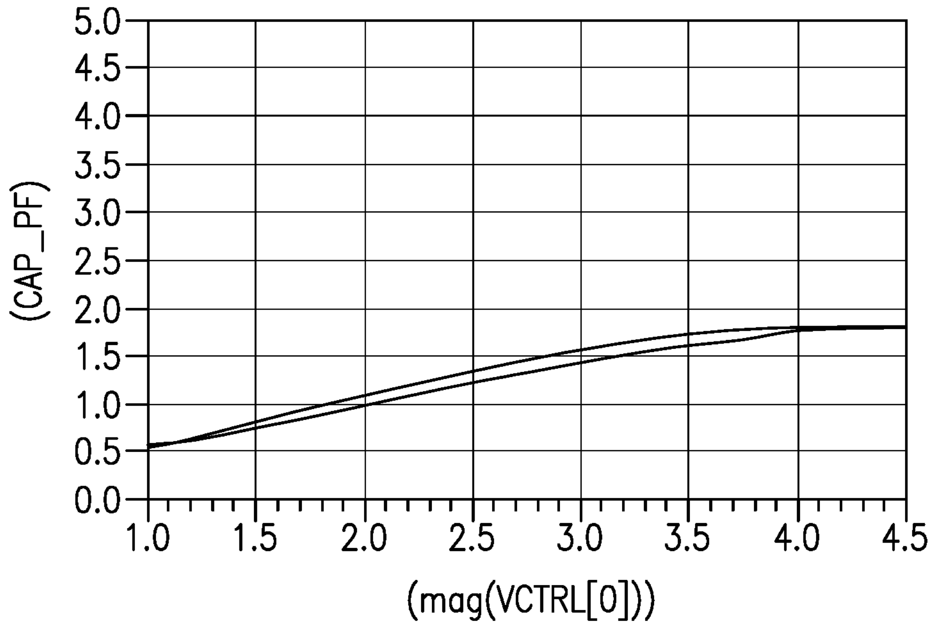
FIG. 9 shows the capacitance as a function of magnitude of the control voltage of FIG. 8.

FIG. 9 shows the capacitance as a function of magnitude of the control voltage VCTRL of FIG. 8. One can see that the capacitance has a monotonically increasing relationship, including a linear portion, with the control voltage magnitude.

Figure 10A:
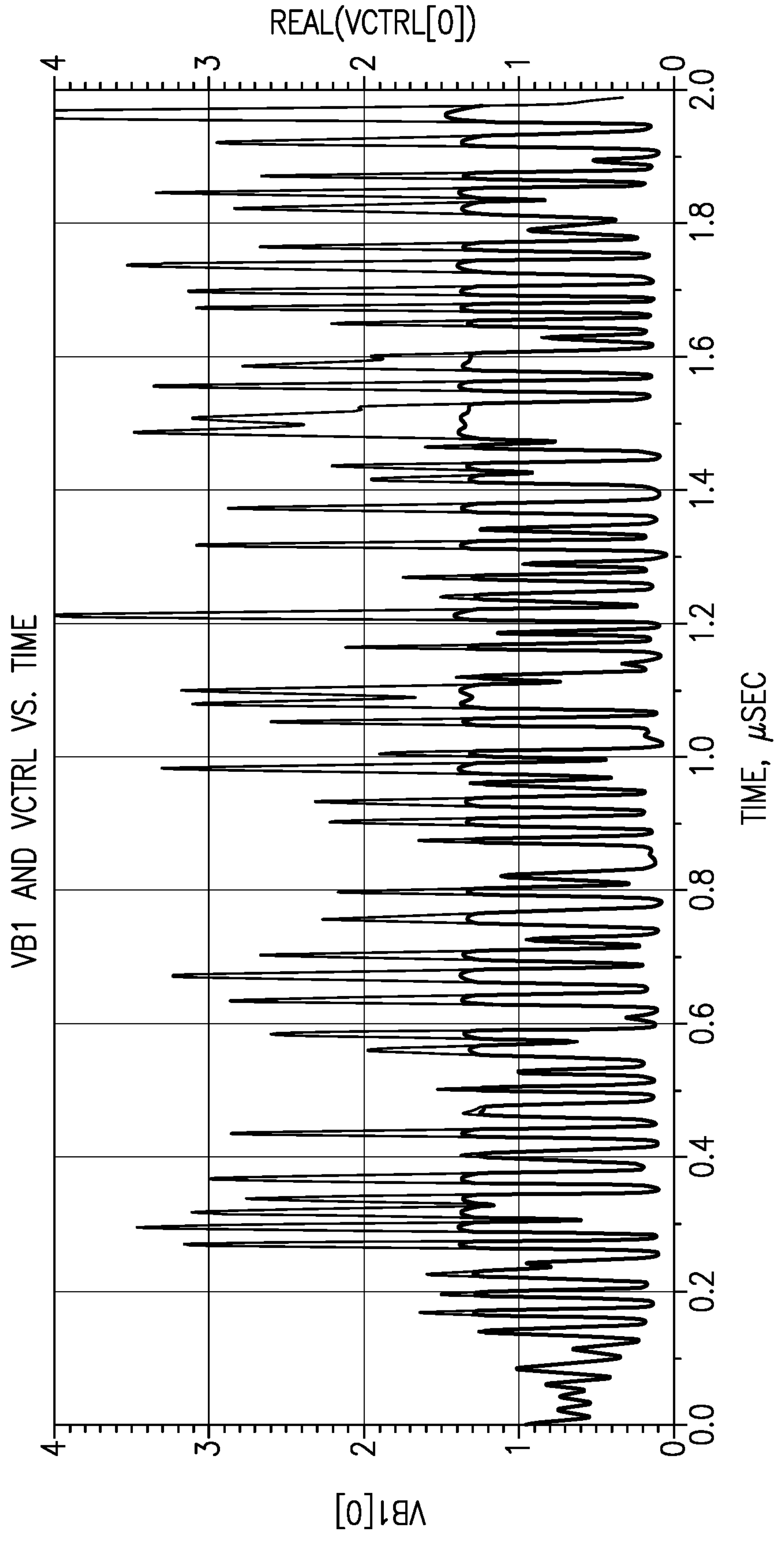
FIGS. 10A to 10F show superimposed time traces of voltages across the respective switches and the control voltage.
Figure 10B:
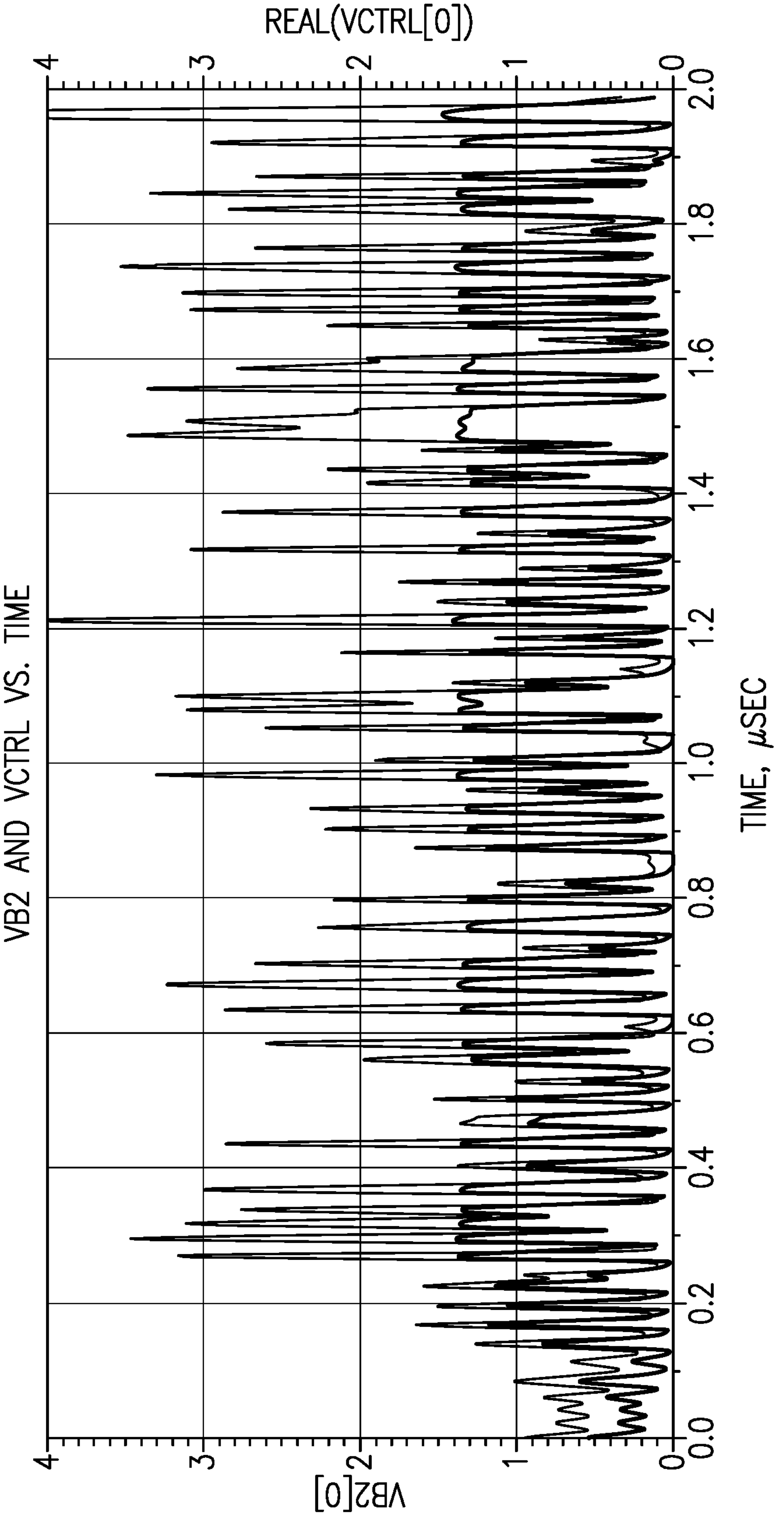
Figure 10C:
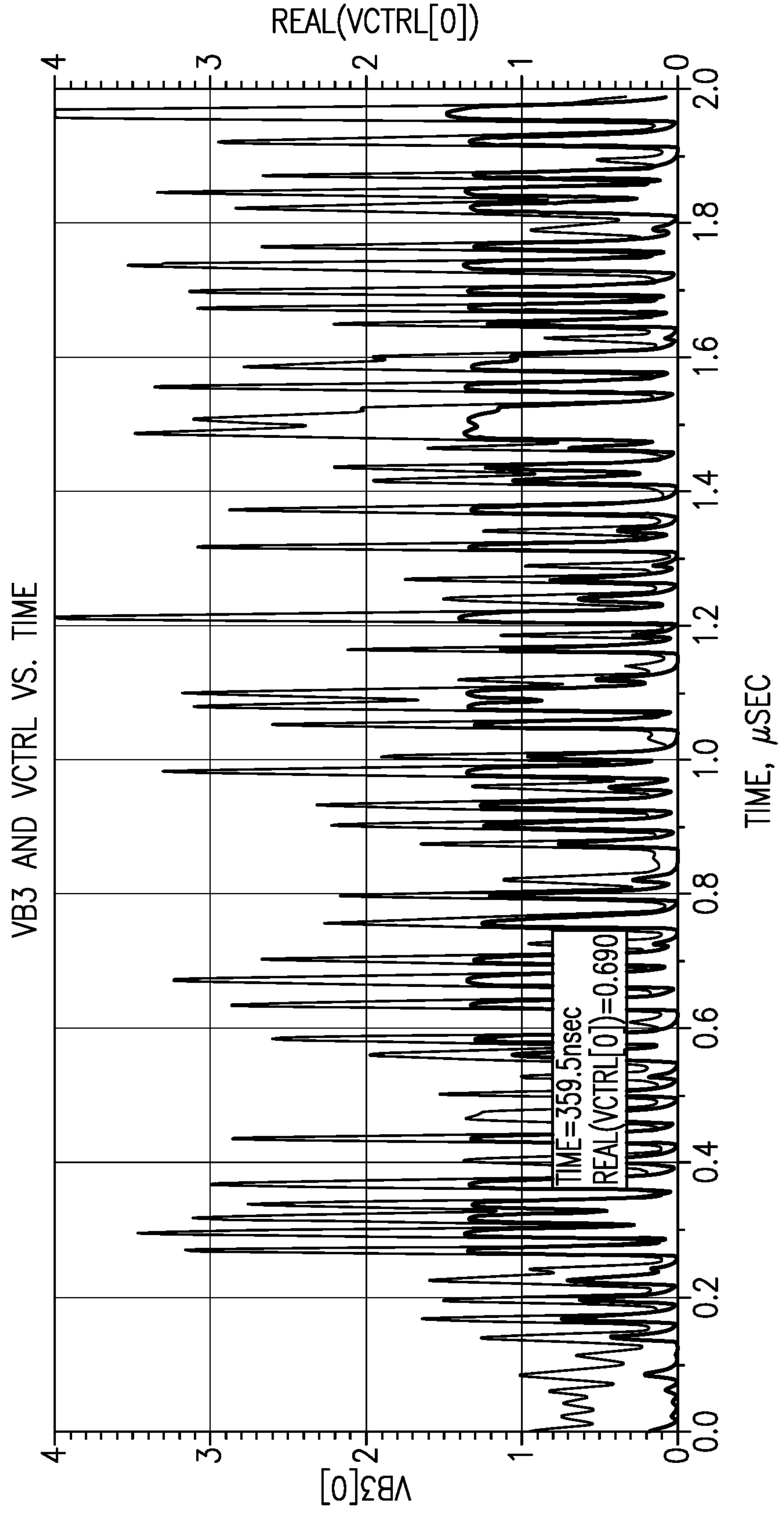
Figure 10D:
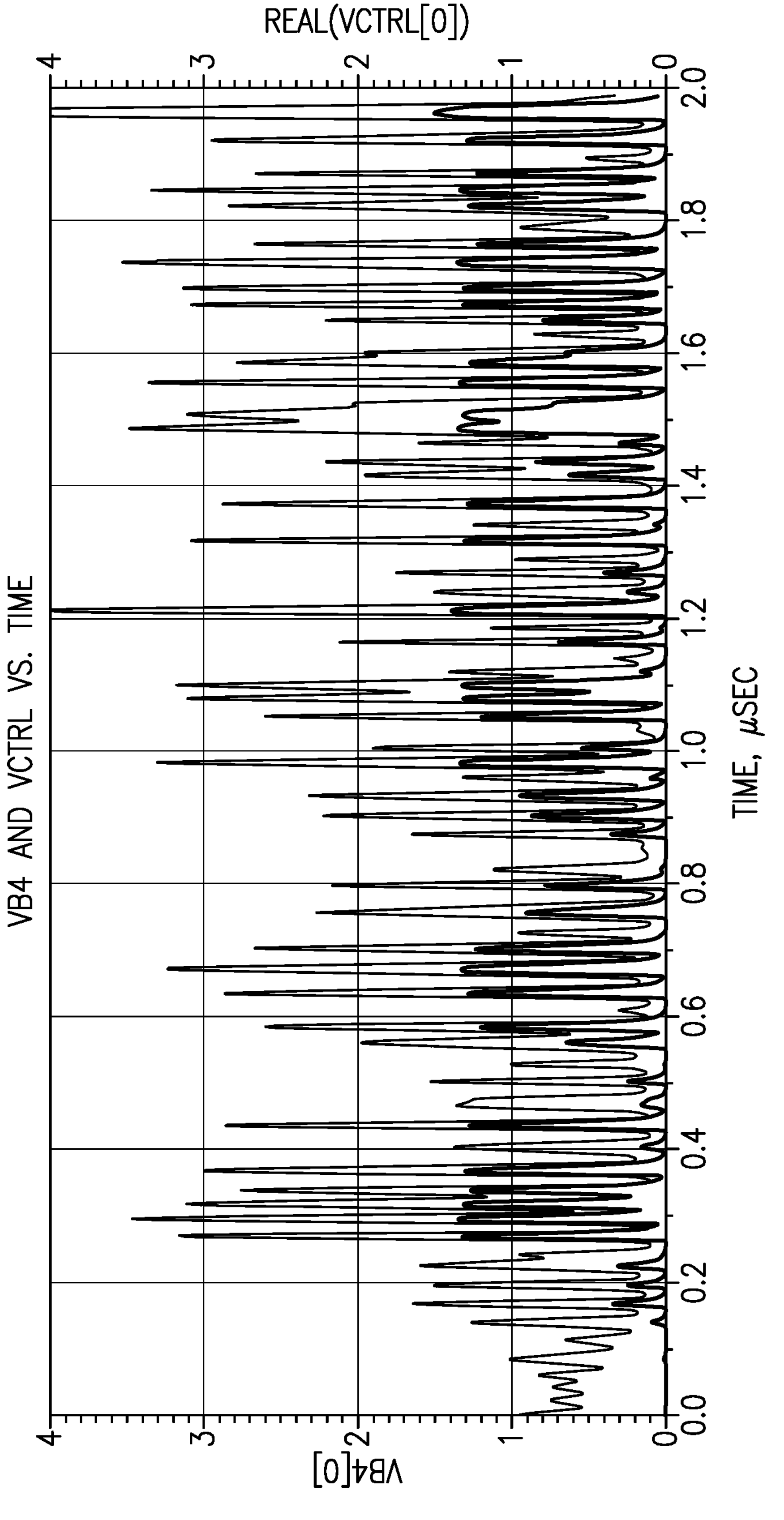
Figure 10E:
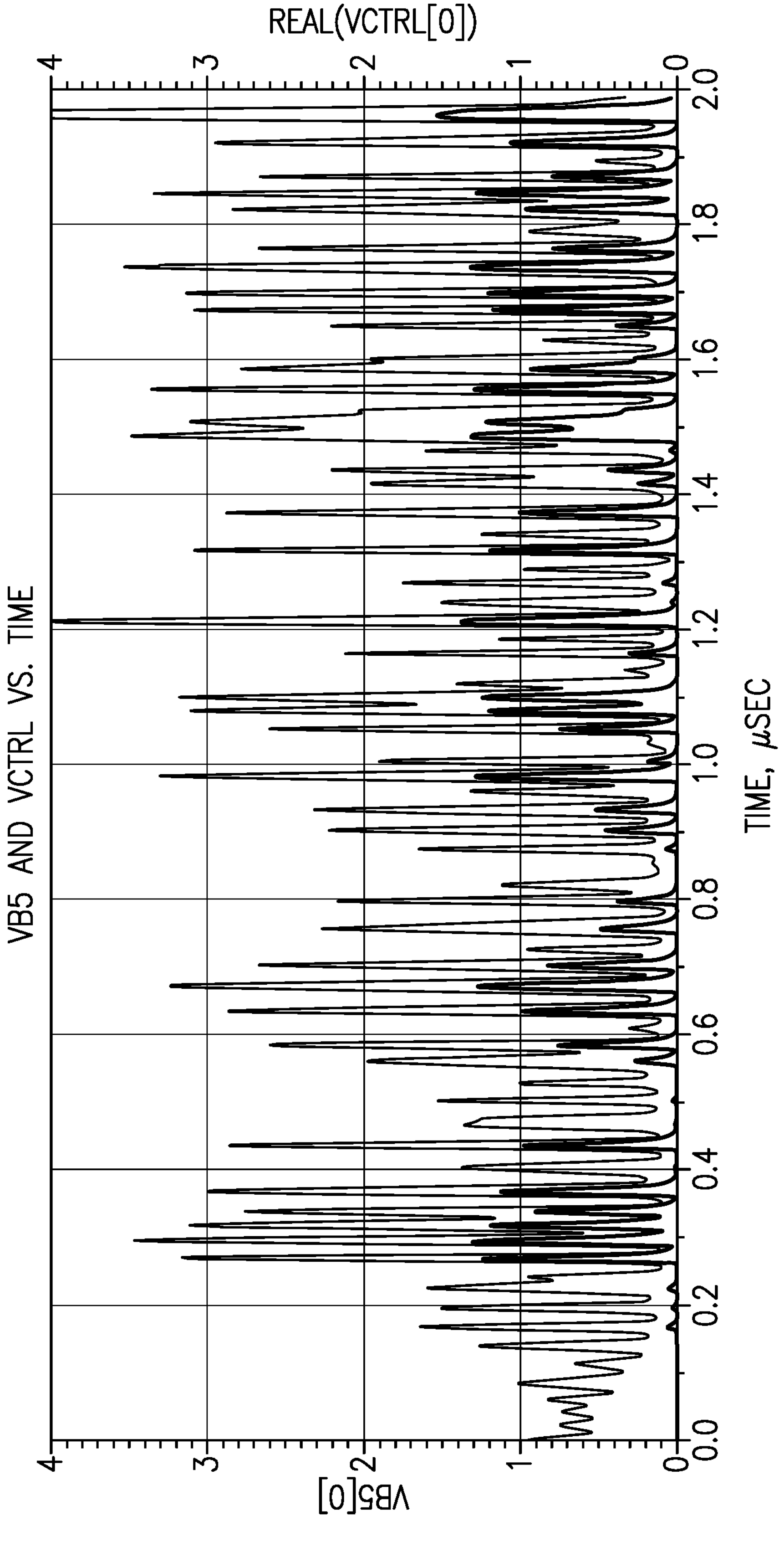
Figure 10F:
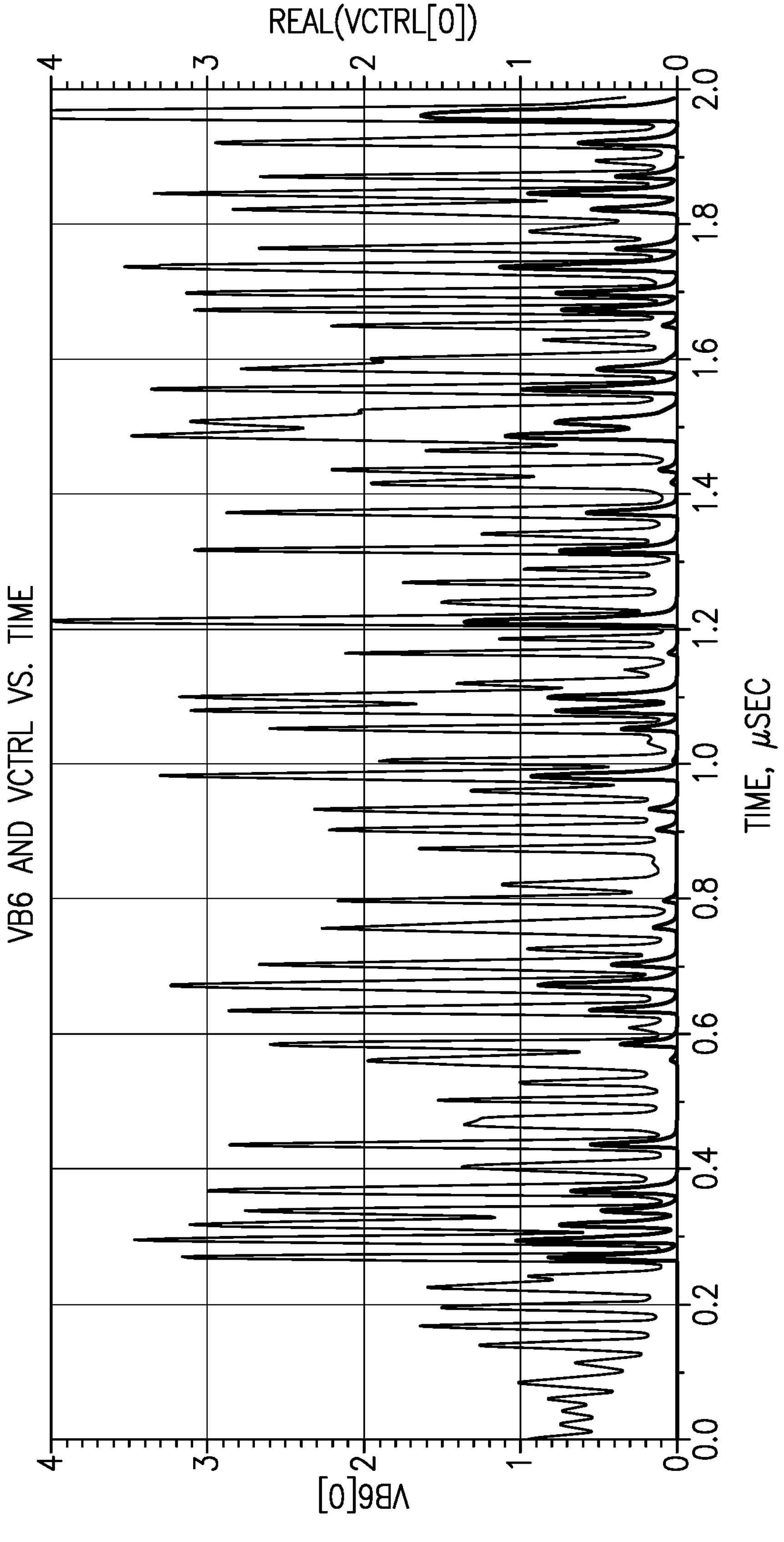

FIGS. 10A to 10F show superimposed time traces of voltages across the respective switches and the control voltage VCTRL. More particularly, FIG. 10A shows superimposed time traces of voltages across switch S1 of the load modulator 100 of FIG. 2 and the control voltage VCTRL. Similarly, FIG. 10B shows superimposed time traces of voltages across switch S2 and the control voltage VCTRL; FIG. 10C shows superimposed time traces of voltages across switch S3 and the control voltage VCTRL; FIG. 10D shows superimposed time traces of voltages across switch S4 and the control voltage VCTRL; FIG. 10E shows superimposed time traces of voltages across switch S5 and the control voltage VCTRL; and FIG. 10F shows superimposed time traces of voltages across switch S6 and the control voltage VCTRL.

Figure 11A:
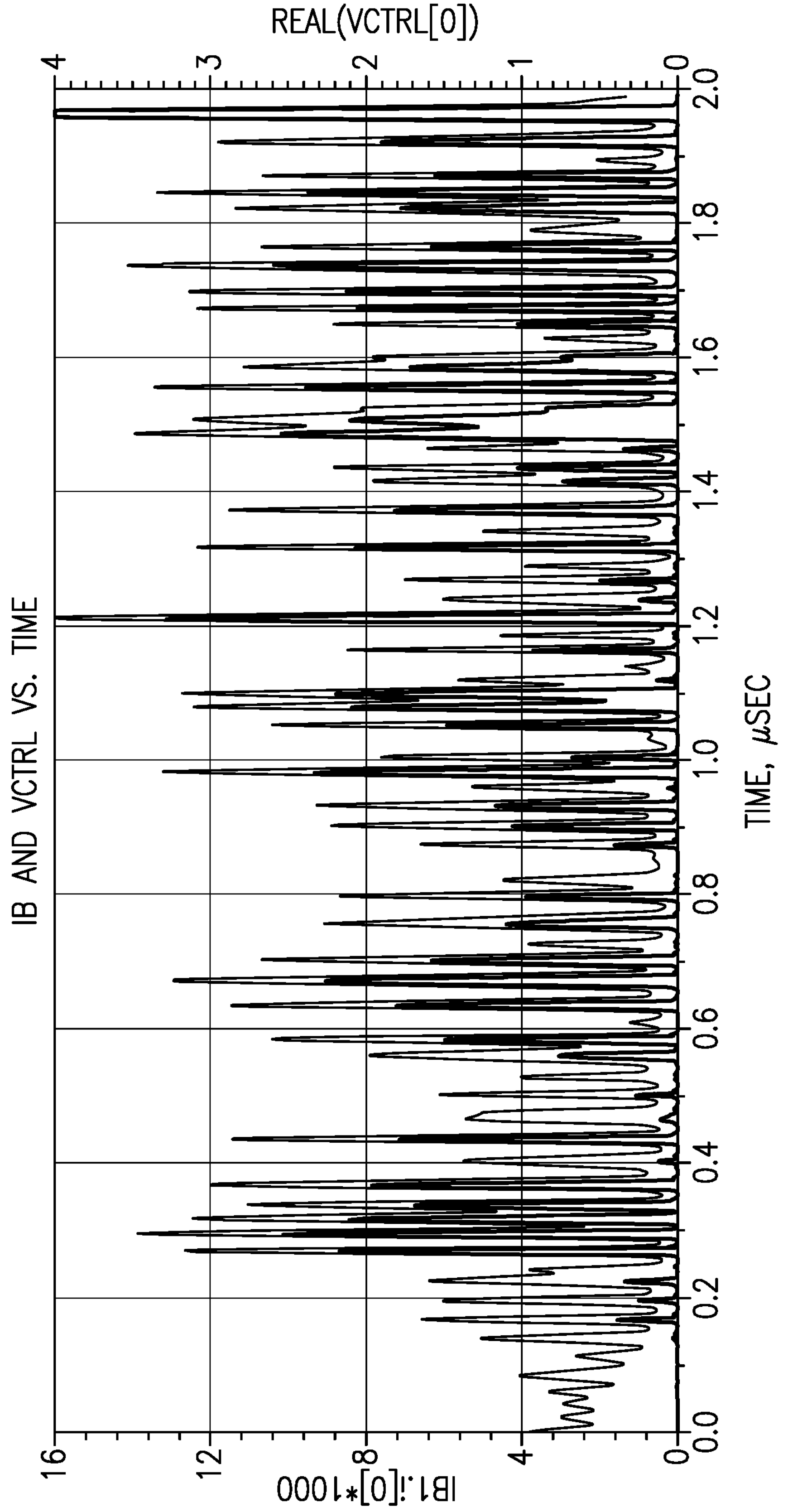
FIGS. 11A to 11F show superimposed time traces of currents through the respective switches and the control voltage.
Figure 11B:
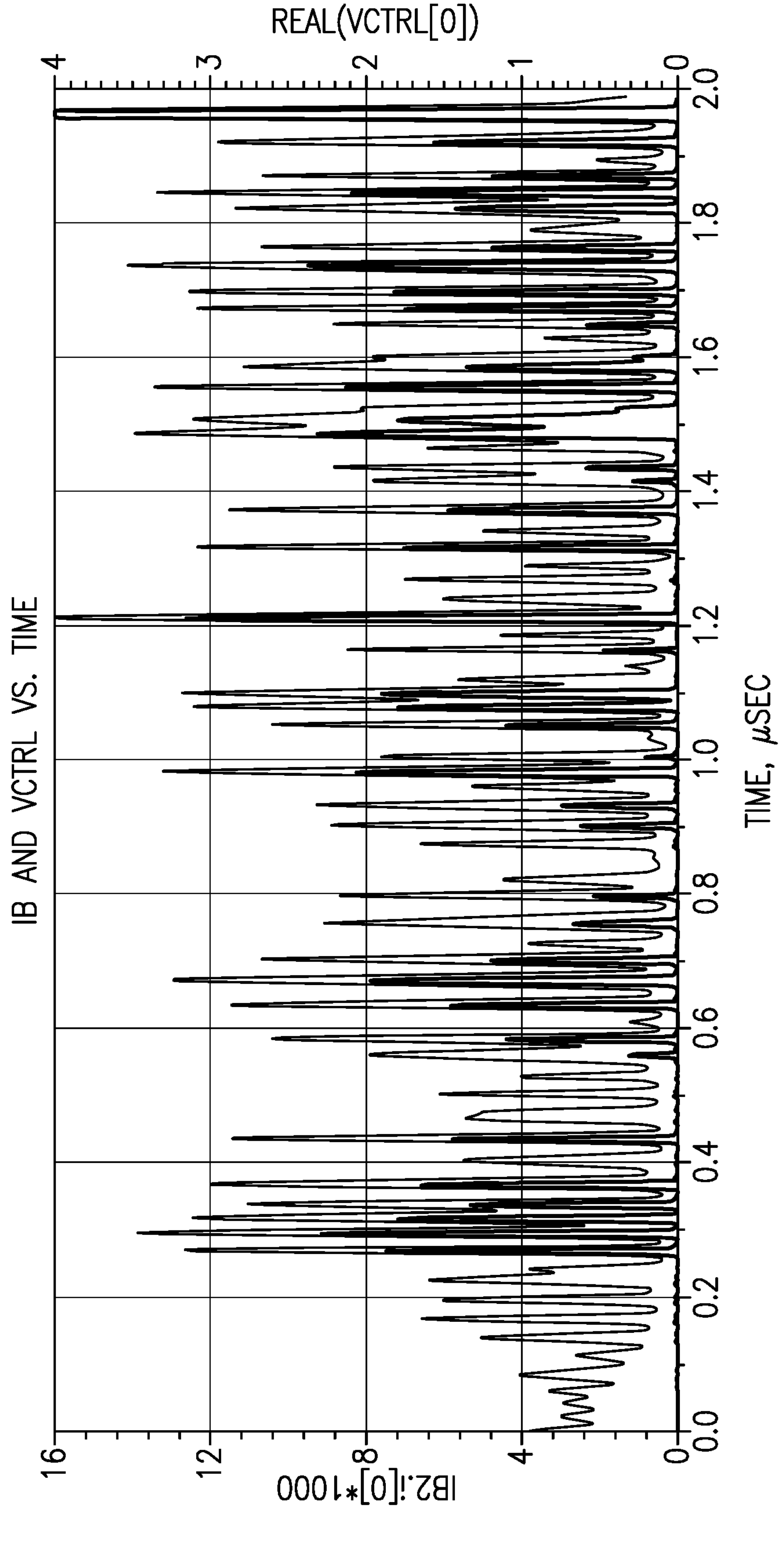
Figure 11C:
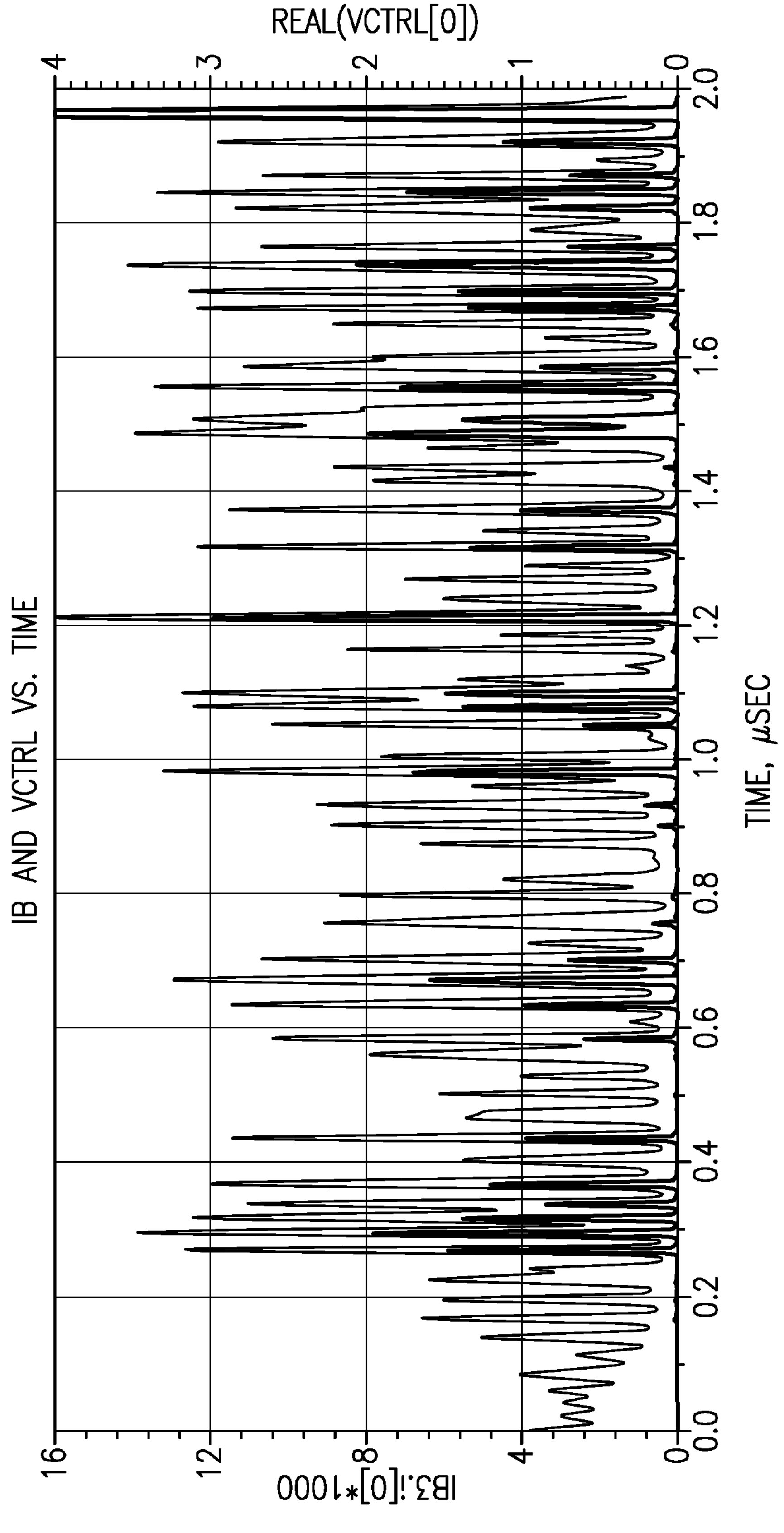
Figure 11D:
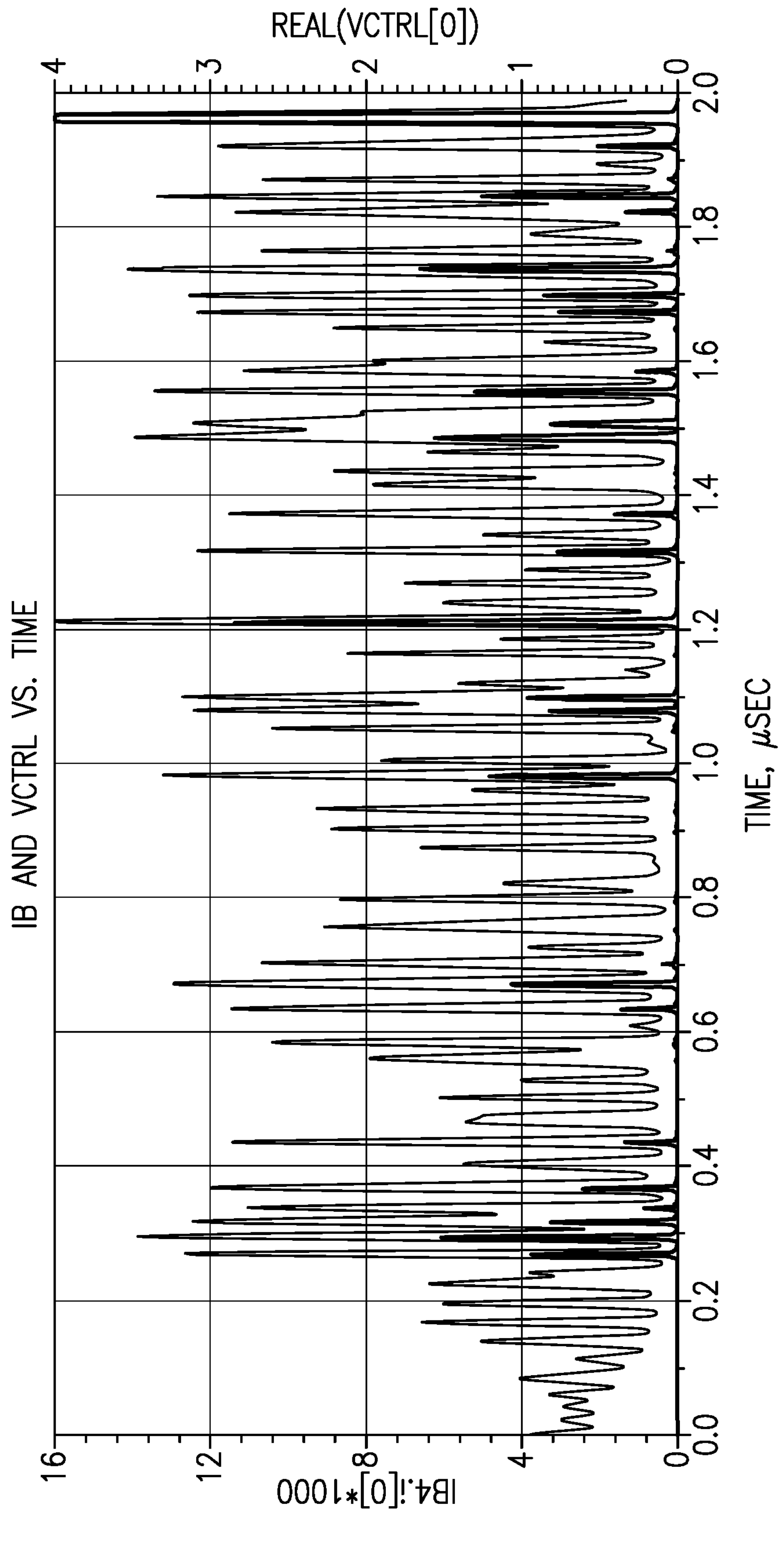
Figure 11E:
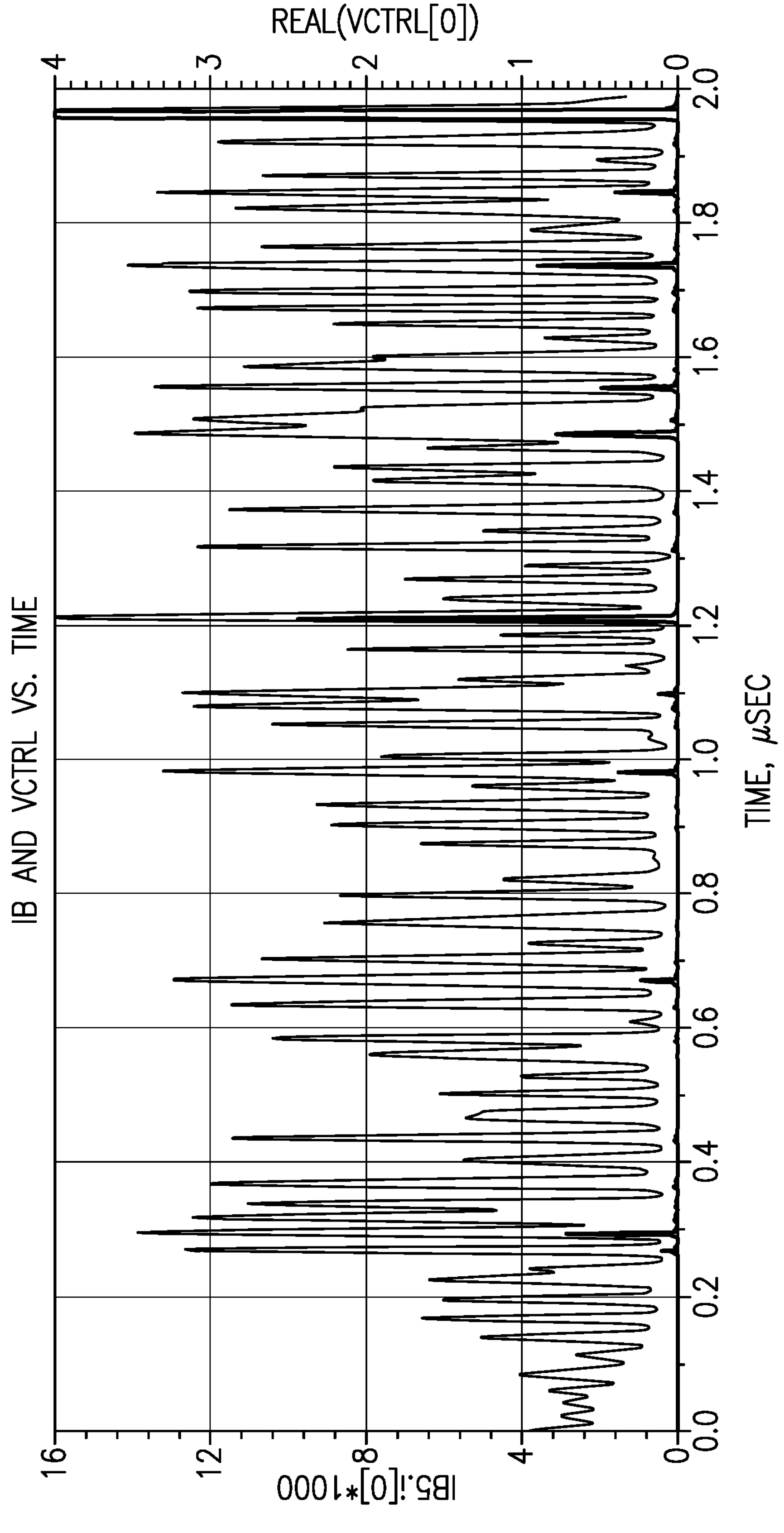
Figure 11F:
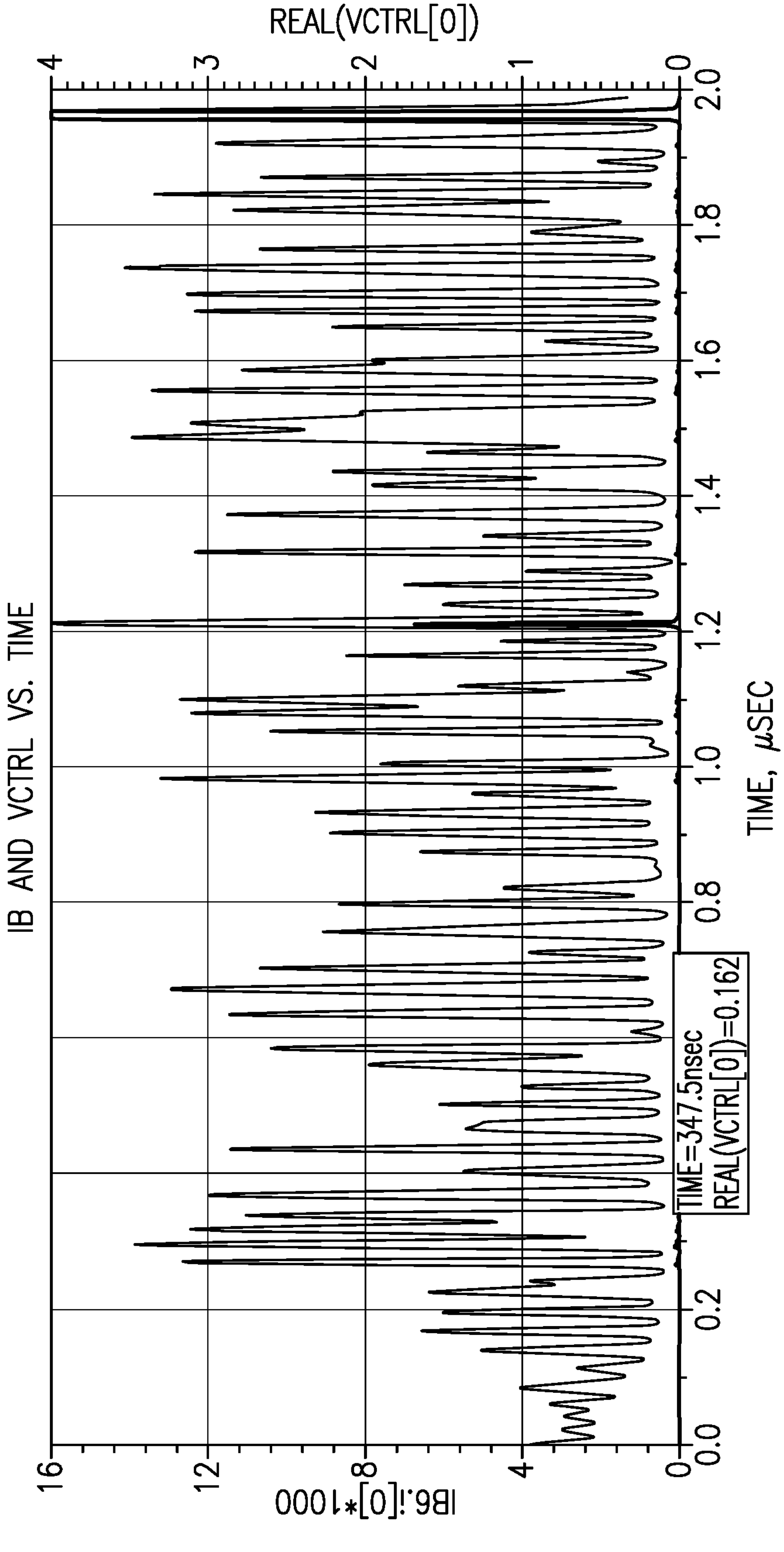

FIGS. 11A to 11F show superimposed time traces of currents through the respective switches and the control voltage VCTRL. More particularly, FIG. 11A shows superimposed time traces of currents through switch S1 of the load modulator 100 of FIG. 2 and the control voltage VCTRL. Similarly, FIG. 11B shows superimposed time traces of currents across switch S2 and the control voltage VCTRL; FIG. 11C shows superimposed time traces of currents across switch S3 and the control voltage VCTRL; FIG. 11D shows superimposed time traces of currents across switch S4 and the control voltage VCTRL; FIG. 11E shows superimposed time traces of currents across switch S5 and the control voltage VCTRL; and FIG. 11F shows superimposed time traces of currents across switch S6 and the control voltage VCTRL.

Figure 12:
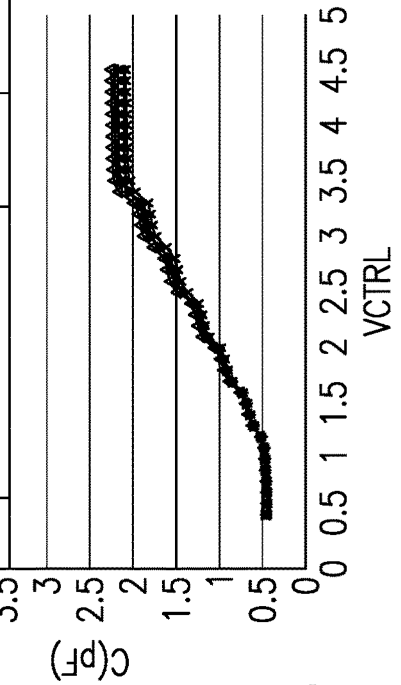
FIG. 12 shows plots of capacitance vs control voltage measured on a sample load modulator based on the design of FIG. 2.
Figure 12:
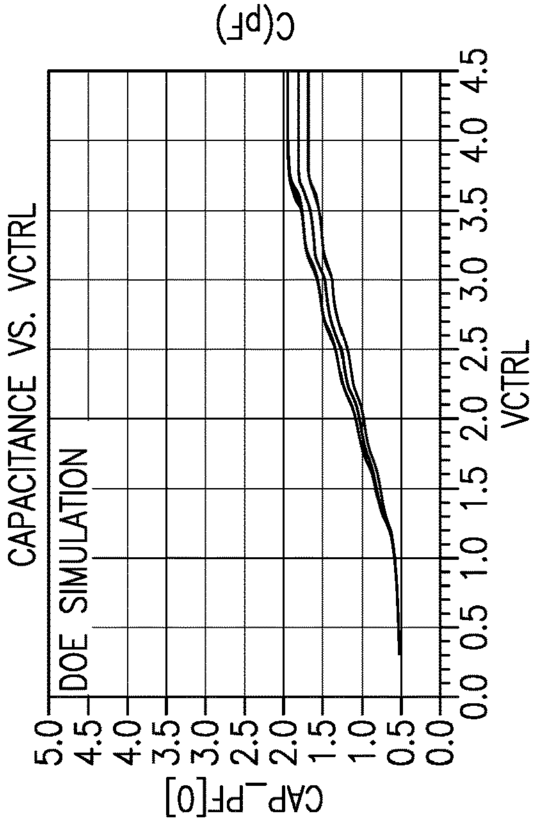

FIG. 12 shows plots of capacitance vs control voltage VCTRL measured on load modulators based on the design of FIG. 2 (right panel), for different wafer batches, different bias currents resulting from maximum VCTRL values, and different bandwidths. One can see that such relationships between capacitance and VCTRL are generally similar to the simulated results on the left panel.

FIG. 13 shows plots of effective series resistance (ESR) vs capacitance measured on load modulators based on the design of FIG. 2, for different wafer batches, different bias currents resulting from maximum VCTRL values, and different bandwidths (right panel). One can see that such relationships between ESR and capacitance are generally similar to the simulated result on the left panel.

Figure 14:
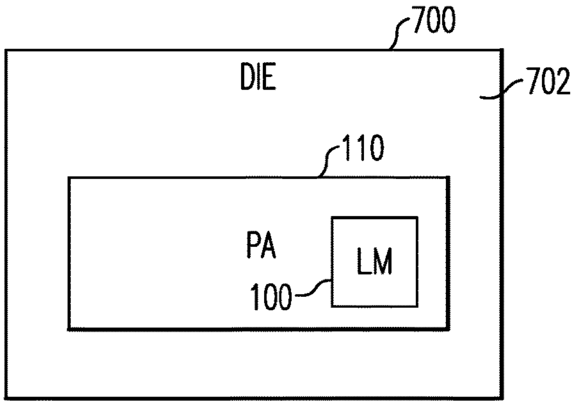
FIG. 14 shows that in some embodiments, a semiconductor die can include a power amplifier having a load modulator as described herein.

FIG. 14 shows that in some embodiments, a semiconductor die 700 can include a power amplifier 110 having a load modulator (LM) 100 as described herein. Such a power amplifier can be implemented on a semiconductor substrate 702.

Figure 15:
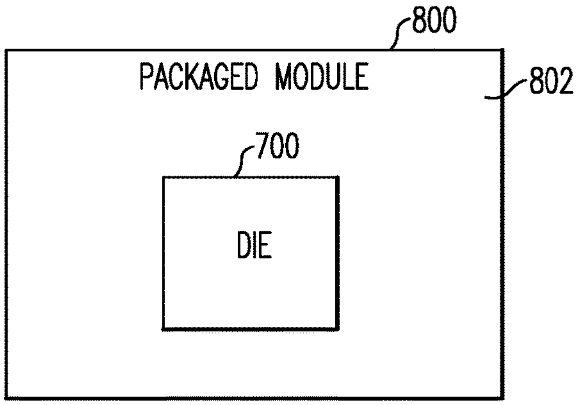
FIG. 15 shows that in some embodiments, one or more features as described herein can be implemented in a packaged module.

FIG. 15 shows that in some embodiments, one or more features as described herein can be implemented in a packaged module 800. Such a packaged module can include a packaging substrate 802 configured to receive a plurality of components. At least some of the components mounted on the packaging substrate 802 can include a die such as the die 700 of FIG. 14.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 16:
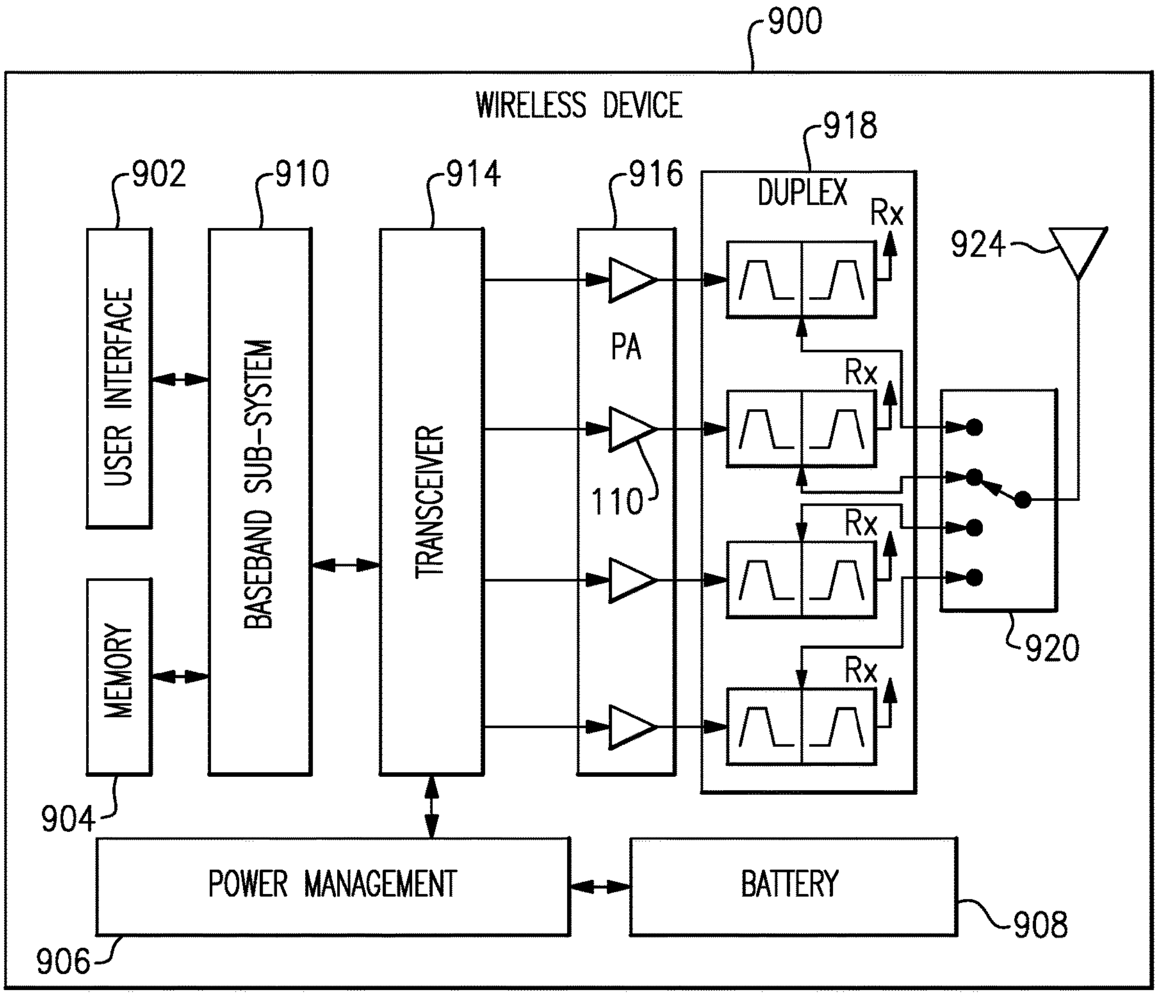
FIG. 16 depicts an example wireless device having one or more advantageous features described herein.

FIG. 16 depicts an example wireless device 900 having one or more advantageous features described herein. In some embodiments, one or more power amplifiers 110 can include a load modulation feature as described herein. In some embodiments, such one or more power amplifiers can be implemented on a power amplifier module 916.

In the example wireless device 900, the power amplifier (PA) module 916 having a plurality of PAs can provide one or more amplified RF signals to the switch 920 (via an assembly of one or more duplexers 918), and the switch 920 can route the amplified RF signal(s) to one or more antennas. In some embodiments, the PAs in the module 916 can receive corresponding unamplified RF signal(s) from a transceiver 914 that can be configured and operated in known manners. The transceiver 914 can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexers 918 can allow transmit and receive operations to be performed simultaneously using a common antenna (e.g., 924). In FIG. 16, received signals are shown to be routed to "Rx" paths that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The invention claimed is:

1. A power amplifier comprising:

an input stage implemented as a cascode driver stage;

an output stage implemented as a final stage including a push-pull amplifier and coupled to the input stage and having an output node, the push-pull amplifier including a splitter having an input and a pair of outputs, each output coupled to an input of a respective amplifier configured to operate with a Class AB bias, the push-pull amplifier further including a combining circuit that combines outputs of the pair of amplifiers; and a load modulation circuit coupled to the output node of the output stage and configured to provide variable capacitance that depends on a control voltage, the combining circuit including a transformer circuit having a primary with first and second nodes coupled to the outputs of the pair of amplifiers, and a secondary with first and second nodes, the first node coupled to the output node and the second node coupled to ground through the load modulation circuit.

2. The power amplifier of claim 1 wherein the cascode driver stage is configured to operate with a Class AB bias.

3. A power amplifier comprising:

an input stage implemented as a driver stage;

an output stage implemented as a final stage and coupled to the input stage and having an output node; and a load modulator coupled to the output node of the output stage and configured to provide variable capacitance that depends on a control voltage, the load modulator including a plurality of switchable capacitances arranged in parallel between a node that is coupled to the output node of the final stage and ground, each switchable capacitance including a series arrangement of a capacitance and a switch, such that turning on the switch results in the respective capacitance contributing to a total capacitance of the load modulator, each switch being coupled to a common control node through a respective bias path, the bias path configured such that the switch turns on at a respective value of the control voltage different from control voltage value(s) associated with the other switch(es).

4. The power amplifier of claim 3 wherein the bias paths include different numbers of diodes to accommodate the different control voltage values turning on the respective switches.

5. The power amplifier of claim 4 wherein the first bias path has no diode, and the remaining bias paths include successively increasing number of diodes arranged in series.

6. The power amplifier of claim 5 wherein load modulator includes six switchable capacitances arranged in parallel.

7. The power amplifier of claim 5 wherein each bias path includes a respective resistance selected to turn of the respective switch with the provided control voltage.

8. The power amplifier of claim 3 wherein each switch is implemented as a transistor having a base, a collector and an emitter, the base coupled to the common control node through the respective bias path, the collector coupled to the respective capacitance, the emitter coupled to the ground.

9. The power amplifier of claim 8 wherein the base of each transistor is coupled to the ground through a path including a series arrangement of a diode and a resistance.

10. The power amplifier of claim 8 wherein the base of each transistor is coupled to the ground through a path including a capacitance.

11. The power amplifier of claim 8 wherein the base of each transistor is coupled to the ground through a pull down circuit having a first node coupled to the base of the transistor and a second node coupled to the ground, the pull down circuit configured to turn on and divert a bias voltage from the base of the transistor to the ground if the bias voltage exceeds a threshold value.

12. The power amplifier of claim 11 wherein the pull down circuit includes a transistor having a base, a collector and an emitter, the collector coupled to the first node, the emitter coupled to the second node, the collector coupled to the base through a Schottky diode, the emitter coupled to the collector through a diode.

13. A method for amplifying a radio-frequency signal, the method comprising:

partially amplifying a signal with an input stage implemented as a driver stage;

further amplifying an amplified signal obtained from at least the input stage with an output stage implemented as a final stage; and providing load modulation for the further-amplified signal by providing a variable capacitance to an output node of the output stage, the variable capacitance depending on a control voltage, the providing of load modulation including controlling a plurality of switchable capacitances arranged in parallel between a node that is coupled to the output node of the final stage and ground, each switchable capacitance including a series arrangement of a capacitance and a switch, such that turning on the switch results in the respective capacitance contributing to a total capacitance of the load modulation, each switch being coupled to a common control node through a respective bias path, the bias path configured such that the switch turns on at a respective value of the control voltage different from control voltage value(s) associated with the other switch(es).

* * * * *